(12) United States Patent
Yousefzadeh et al.

(10) Patent No.: US 7,977,994 B2
(45) Date of Patent: Jul. 12, 2011

(54) DIGITAL PULSE-WIDTH-MODULATOR WITH DISCRETELY ADJUSTABLE DELAY LINE

(75) Inventors: Vahid Yousefzadeh, Boulder, CO (US); Anthony Carosa, Breckenridge, CO (US); Toru Takayama, Tokyo (JP); Dragan Maksimovic, Boulder, CO (US)

(73) Assignee: The Regents of the University of Colorado, A Body Corporate, Denver, CO (US)

( * ) Notice: Subject to any disclaimer, the term of this patent is extended or adjusted under 35 U.S.C. 154(b) by 197 days.

(21) Appl. No.: 12/138,864

(22) Filed: Jun. 13, 2008

(65) Prior Publication Data

US 2009/0066382 A1 Mar. 12, 2009

Related U.S. Application Data

(60) Provisional application No. 60/944,483, filed on Jun. 15, 2007.

(51) Int. Cl.
*H03H 11/26* (2006.01)
(52) U.S. Cl. ......... 327/270; 327/269; 327/273; 327/274
(58) Field of Classification Search .......... 327/269–270, 327/273–274, 263
See application file for complete search history.

(56) References Cited

U.S. PATENT DOCUMENTS

| | | | |
|---|---|---|---|
| 5,396,247 A | 3/1995 | Watanabe | |
| 5,631,550 A | 5/1997 | Castro | |
| 6,005,377 A | 12/1999 | Chen | |
| 6,140,777 A | 10/2000 | Wang | |
| 6,833,691 B2 | 12/2004 | Chapuis | |
| 7,061,292 B2 | 6/2006 | Maksimovic | |
| 7,157,951 B1 * | 1/2007 | Morrison et al. | 327/263 |
| 7,249,267 B2 | 7/2007 | Chapuis | |
| 7,315,270 B2 | 1/2008 | Maksimovic | |
| 2006/0227861 A1 | 10/2006 | Makslmovic | |

FOREIGN PATENT DOCUMENTS

| | | |
|---|---|---|
| JP | 59-025577 A | 2/1984 |
| JP | 04-197075 A | 7/1992 |
| JP | 05-259907 A | 10/1993 |

(Continued)

OTHER PUBLICATIONS

Yousefzadeh, V.; Takayama, T.; Maksimovi, D.; , "Hybrid DPWM with Digital Delay-Locked Loop," Computers in Power Electronics, 2006. COMPEL '06. IEEE Workshops on , vol., No., pp. 142-148, Jul. 16-19, 2006.*

(Continued)

*Primary Examiner* — Lincoln Donovan
*Assistant Examiner* — John W Poos
(74) *Attorney, Agent, or Firm* — Hamilton, DeSanctis & Cha LLP; Thomas J. Osborne, Jr.

(57) ABSTRACT

A hybrid digital pulse width modulator (DPWM) with digital delay-locked loops (DLLs) is provided. In this implementation, the digital pulse-width-modulator is synthesizable and includes a digital delay-locked loop around a delay-line to achieve constant frequency clocked operation. In this implementation, the resolution of the modulator is consistent over a wide range of process or temperature variations. The DPWM may implement trailing-edge, leading-edge, triangular, or phase-shift modulation. In an implementation suitable for DC-DC converters with synchronous rectifiers, for example, the DPWM may include two or more outputs for programmable dead-times. In another implementation, a digital pulse-width-modulator with a digital phase-locked loop is also provided.

38 Claims, 18 Drawing Sheets

FOREIGN PATENT DOCUMENTS

WO WO 03/050637 A3 6/2003

OTHER PUBLICATIONS

Ben-Yakov, Sam et al. "PWM Converters with resistive input", IEEE Transactions on Industrial Electronics, vol. 45, No. 3, Jun. 1998, pp. 519-520.

Brown, Ron et al., "Once cycle control IC Simplifies PFC Design", IEEE APEC 2005 IR 1150. www.irf.com., pp. 825-829.

Buso, Simone et al. "Simple digital control improving dynamic performance of power factor preregulators", IEEE Transactions on Power Electronics, vol. 13, No. 5, Sep. 1998, pp. 814-823.

Corradini, L. et al. "Analysis of multiple sampling technique for digitally controlled dc-dc converters", Department of Information Engineering, University of Padova, Italy, IEEE PESC 2006, pp. 1-6.

Dancy, Abram P. et al. "High-efficiency multiple-output DC-DC conversion for low-voltage systems", VLSI Systems, IEEE Transactions on very large scale integration (VLSI) Systems, vol. 8, No. 3 Jun. 2000, pp. 252-263.

Dancy Abram P. et al. "Ultra Low Power Control Circuits for PWM Converters", IEEE PESC 1997, vol. 1, pp. 21-27.

De Castro, Angelo et al. "Concurrent and Simple Digital Controller of an AC/DC converter with power factor correction based on an FPGA", IEEE Transactions on Power Electronics, vol. 18, No. 1, Jan. 2003, pp. 334-343.

De Gusseme, Koen et al., "Sample Correction for digitally controlled boose PFC Converters operating both in CCM and DCM", Proc IEEE APEC, Conf. 2003, pp. 389-395.

Djemouai, A. et al. "New CMOS Integrated pulse width modulator for voltage conversion applications", IEEE ICECS, vol. 1, 2000, pp. 116-119.

Foley, Raymond F. et al. "An area-efficient digital pulsewidth modulation architecture suitable for FPGA implementation", IEEE APEC 2005, vol. 3, pp. 1412-1418.

Garcia, O. et al. "Effect of the Tolerances in Multi-Phase DC-DC Converters", Power Electronics Specialists 2005, IEEE 36th Conference pp. 1452-1457.

Goodman, James et al. "An Energy/Security Scalable Encryption Processor Using an Embedded Variable Voltage DC/DC Converter", Solid-State Circuits, IEEE Journal, vol. 33, No. 11, 1998, pp. 1799-1809.

Gregner, Joel P. et al. "Linear peak current mode control: a simple active power factor correction control technique for continuous conduction mode", IEEE PESC 1996, pp. 196-202.

Gu-Yeon et al. "A Low power switching power supply for self-clocked systems" International Symposium on Low Power Electronics and Design, Monterey, CA., Aug. 1996. pp. 313-317.

Huang, Wenkang, "A new control for multi-phase buck converter with fast transient response", IEEE Applied Power Electronics Conference and Exposition 2001, APEC '01, pp. 273-279.

Huang, Wenkang, "The design of a high-frequency multiphase voltage regulator with adaptive voltage positioning and all ceramic capacitors", IEEE Applied Power Electronics Conference and Exposition 2005 pp. 270-275.

Jakobsen, L. T. et al. "Hybrid Control Method for a Single Phase PFC using a Low Cost Microcontroller", IEEE APEC 2005, pp. 1710-1715.

Johns, A. D. et al. "Analog Integrated Circuit Design—Chapter 14, Oversampling Converters", New York Wiley, 1997, pp. 531-547.

Kim, Sangsun et al. "Control of multiple single phase PFC modules with a single low-cost DSP", IEEE Transactions on Industry Applications, vol. 39, No. 5, Sep./Oct. 2003, pp. 1379-1385.

Lai, Zheren et al. "A family of continuous-conduction-mode power-factor-correction controllers based on the general pulse-width modulator", IEEE Transactions on Power Electronics, vol. 13, No. 3, May 1998, pp. 501-510.

Lee, Kisun et al. "A novel control method for multiphase voltage regulators", IEEE Applied Power Electronics Conference and Exposition 2003, pp. 738-743.

Lukic, Zdravko et al. "High-Frequency Digital Controller for DC-DC Converters Based on Multi-Bit ΣΔ Pulse-Width Modulation", IEEE APEC 2005, pp. 35-40.

Mattavelli, Paolo et al. "Predictive digital control of power factor preregulators with input voltage estimation using disturbance observers", IEEE Transactions on Power Electronics, vol. 20, No. 1, Jan. 2005, pp. 140-147.

Mattavelli, Paolo et al. "Digital Control of Single-Phase Power Factor Preregulators Suitable for Smart-Power Integration", 35th Annual IEEE Power Electronics Specialties Conference, 2004; pp. 3195-3201.

Miao, Botao et al. "Automated digital controller design for switching converters", IEEE Power Electronics Specialists, 2005, pp. 2729-2735.

O'Malley, Eamon et al "A Programmable Digital Pulse width modulator providing versatile pulse patters and supporting switching frequencies beyond 15 MHz", IEEE APEC, vol. 1, 2004, pp. 53-59.

Peterchev, Angel V. et al. "Design of ceramic-capacitor VRM's with estimated load current feed forward", 35th Annual IEEE Power Electronics Specialists Conference, 2004, pp. 4325-4332.

Prodic, Aleksandar et al. "Dead-zone digital controller for improved dynamic response of power factor preregulators", IEEE Applied Power Electronics Conference 2003, pp. 382-388.

Prodic, Aleksandar et al. "Dead-zone digital controllers for improved dynamic response of low harmonic rectifiers", IEEE Transactions on Power Electronics, vol. 21, No. 1, Jan. 2006, pp. 173-181.

Prodic, Aleksandar et al. "Self-turning digitally controlled low-harmonic rectifier having fast dynamic response", IEEE Transactions on Power Electronics, vol. 18, No. 1, Jan. 2003, pp. 420-428.

Qiu, Yang et al. "High-bandwidth designs for voltage regulators with peak-current control", IEEE Applied Power Electronics Conference and Exposition 2006, pp. 24-30.

Qiu, Yang et al. "The multi-frequency small-signal model for buck and multiphase interleaving buck converters", IEEE Applied Power Electronics Conference and Exposition 2005, pp. 392-398.

Rajagopalan, Jay et al. "A general technique for derivation of average current mode control laws for single-phase power-factor-correction circuits without input voltage sensing", IEEE Transactions on Power Electronics, vol. 14, No. 4, Jul. 1999, pp. 663-672.

Soto, A. et al. "Non-linear digital control breaks bandwidth limitations", IEEE Applied Power Electronics Conference and Exposition 2006, pp. 724-730.

Spiazzi, Giorgio et al. "Power factor preregulators with improved dynamic response", IEEE Transactions on Power Electronics, vol. 12, Mar. 1997, pp. 343-349.

Syed, Asif et al. "Digital pulse width modulator architectures", 35th Annual IEEE Power Electronics Specialities conference, vol. 6, 2004, pp. 4689-4695.

Syed, Asif et al. "Digital PWM Controller with Feed-Forward Compensation", IEEE APEC, vol. 1, 2004 pp. 60-66.

Van Tuijl, Ed et al. "A 128 f(subscript s) Multi-Bit ΣΔ CMOS Audio DAC with Real-Time DEM and 115 dB SFDR", IEEE International Solid-State Circuits Conference, vol. 11, 2004. 8 pages.

Wong, Pit-Leong et al. "Voltage regulator module (VRM) transient modeling and analysis", IEEE Industry Applications Conference 1999, vol. 3, pp. 1669-1676.

Wu, Albert M. et al."Digital PWM Control: Application in Voltage Regulation Modules", IEEE Power Electronics Specialists Conference, vol. 1, 1999, pp. 77-83.

Yao, Kaiwei et al. "Optimal design of the active droop control method for the transient response", IEEE Applied Power Electronics Conference and Exposition 2003, pp. 718-723.

Yousefzadeh, Vahid et al. "Hybrid DPWM with Digital Delay-Locked Loop", IEEE workshop, Rensselaer Polytechnic Institute, Troy, NY, Jul. 16-19, 2006, pp. 142-148.

Zhang, Wanfeng et al. "A Digital Power Factor Correction (PFC) Control Strategy Optimized for DSP", IEEE Transactions on Power Electronics, vol. 19, No. 6, Nov. 2004, pp. 1474-1485.

Zhang Xin et al. "A novel VRM control with direct load current feedback", IEEE Applied Power Electronics Conference and Exposition 2004, vol. 1 pp. 267-271.

Zumel P. et al. "A simple digital hardware to control a PFC converter", IECON '01: The 27th Annual Conference of the IEEE Industrial Electronics Society, vol. 2, Nov. 29-Dec. 2, 2001, pp. 943-948.

Bibian, Stephane et al., "High Performance Predictive Dead-Beat Digital Controller for DC Power Supplies", Department of Electrical and Computer Engineering, University of British Columbia, Vancouver, BC, Canada V6T 1Z4, IEEE, 2001, pp. 67-63.

Bibian, Stephane et al., "Digital Control With Improved Performance for Boost Power Factor Correction Circuits", Department of Electrical and Computer Engineering, University of British Columbia, Vancouver, BC, Canada V6T 1Z4, IEEE, 2001, pp. 137-143.

Carosa, Tony et al., "Digital Multiphase Modulator—A Power D/A Perspecive", Colorado Power Electronics Center, Department of Electrical and Computer Engineering, University of Colorado, Boulder, CO 80309-0425, USA no date given, 6 pages.

Carosa, Tony et al., "Implementation of a 16 Phase Digital Modulator in a 0.35 um Process", Colorado Power Electronics Center, Department of Electrical and Computer Engineering, University of Colorado, Boulder, CO 80309-0425, USA no date given, 7 pages.

Intel, "VRM 8.3 DC-DC Converter Design Guidelines", Intel Corporation, 2200 Mission College Blvd., P.O. Box 58119, Santa Clara, CA 95052-8119, US, Mar. 1999, pp. 1-14.

Intel, "VRM 9.0 DC-DC Converter Design Guidelines", Intel Corporation, 2200 Mission College Blvd., P.O. Box 58119, Santa Clara, CA 95052-8119, US, Apr. 2002, pp. 1-17.

Intel, "Voltage Regulator Module (VRM) and Enterprise Voltage Regulator-Down (EVRD) 10.0", Intel Corporation, 2200 Mission College Blvd., P.O. Box 58119, Santa Clara, CA 95052-8119, US, Jul. 2005, pp. 1-35.

Lukic, Zdravko et al. "Multibit Σ Δ PWM Digital Controller IC for DC-DC Converters Operating at Switching Frequencies Beyond 10 MHz" IEEE Transactions on Power Electronics, vol. 22, No. 5, Sep. 2007, pp. 1693-1707.

Maksimovic, Dragan et al., "Impact of Digital Control in Power Electronics", Colorado Power Electronics Center, University of Colorado, Boulder, CO 80309-0425, US, Proceedings International Symposium on Power Semiconductor Devices & ICs, Kitakyushu, 2004, pp. 13-22.

Maksimovic, Dragan et al., "Nonlinear-Carrier Control for High-Power-Factor Boost Rectifiers", IEEE Transactions on Power Electronics, vol. 11, No. 4, Jul. 1996, pp. 578-584.

Patella, Benjamin J. et al., "High-Frequency Digital PWM Controller IC for DC-DC Converters", IEEE Transactions on Power Electronics, vol. 18, No. 1, Jan. 2003, pp. 438-446.

Peng, Hao et al., "Digital Current-Mode Controller for DC-DC Converters", Colorado Power Electronics Center, University of Colorado, Boulder, CO 80309-0425, US, IEEE 2005, pp. 899-905.

Peng, Hao et al., "Modeling of Quantization Effects in Digitally Controlled DC-DC Converters", 35th Annual IEEE Power Electronics Specialists Conference, Aachen, Germany, 2004, pp. 4312-4318.

Peterchev, Angel V. et al., "Architecture and IC Implementation of a Digital VRM Controller", IEEE Transactions on Power Electronics, vol. 18, No. 1, Jan. 2003, pp. 356-364.

Peterchev, Angel V. et al., "Digital Loss-Minimizing Multi-Mode Synchroneous Buck Converter Control", 35th Annual IEEE Power Electronics Specialists Conference, Aachen, Germany, 2004, pp. 3694-3699.

Peterchev, Angel V. et al., "Low Conversion Ratio VRM Design", Department of Electrical Engineering and Computer Science, University of California, Berkeley, California, US, IEEE 2002, pp. 1571-1575.

Peterchev, Angel V. et al., "Quantization Resolution and Limit Cycling in Digitally Controlled PWM Converters", IEEE Transactions on Power Electronics, vol. 18, No. 1, Jan. 2003, pp. 301-308.

Prodic, Aleksandar et al., "Digital Controller Chip Set for Isolated DC Power Supplies", Colorado Power Electronics Center, University of Colorado, Boulder, CO 80309-0425, IEEE 2003, pp. 866-872.

Texas Instruments, "TMS320X280X, 2801X, 2804X High Resolution Pulse Width Modulator Reference Guide", Texas Instruments, Post Office Box 655303, Dallas, Texas 75265, Copyright© 2009, Texas Instruments Incorporated, Apr. 2005-13 Revised Feb. 2000, pp. 1-38.

Wong, Pit-Leong et al., "Critical Inductance in Voltage Regulator Modules", IEEE Transactions on Power Electronics, vol. 17, No. 4, Jul. 2002, pp. 485-592.

Yousefzadeh, Vahid et al., "Sensorless Optimization of Dead Times in DC-DC Converters with Synchronous Rectifiers", Colorado Power Electronics Center, University of Colorado, Boulder, CO 80309-0425, US, no date given, 7 pages.

Zane, Regan et al., "Nonlinear-Carrier Control for High-Power-Factor Rectifiers Based on Up-Down Switching Converters", IEEE Transactions on Power Electronics, vol. 13, No. 2, Mar. 1998, pp. 213-221.

Zhang, Yang et al., "Wide-Bandwidth Digital Multi-Phase Controller", Colorado Power Electronics Center, University of Colorado, Boulder, CO 80309-0425, US, no date given, 7 pages.

* cited by examiner

DIGITAL PULSE-WIDTH-MODULATOR WITH DISCRETELY ADJUSTABLE DELAY LINE

CROSS-REFERENCE TO RELATED APPLICATIONS

This application claims the benefit of U.S. provisional application No. 60/944,483, filed 15 Jun. 2007, which is hereby incorporated by reference as though fully set forth herein.

BACKGROUND a. Field

The instant invention relates to a digital pulse-width-modulator comprising a discretely adjustable delay line.

b. Background

Pulse-width-modulation (PWM) is a technique for controlling analog circuits with a digital output in which a duty cycle of a square wave is modulated to encode a specific input signal to a pulse-width modulator. PWM is employed in a wide variety of applications, ranging from measurement and communications to power control and conversion.

High resolution, high frequency digital pulse-width modulators (DPWM) can be used to control DC-DC converters and achieve features such as high bandwidth, precise regulation or elimination of limit cycling disturbances. In Syed, A et al., "Digital pulse-width modulator architectures," IEEE PESC 2004, pp. 4689-95, Vol. 6 (2004), for example, different structures of DPWM topologies are discussed and compared.

The direct implementation of an analog pulse-width-modulator in the digital domain is a counter-based DPWM. An n-bit counter counts up by one step at each input clock period, $t_{clk}$. When the counter counts to its period length, it resets itself and starts counting from the zero value at the next input clock period $t_{clk}$. In such a counter-based DPWM, the required clock frequency is directly dependent on the number of bits of the counter, n, and the desired switching frequency, $f_{sw}=1/T_s$ as shown in the following formula.

$$f_{clk}=2^n f_{sw} \qquad (1)$$

The advantage of a counter-based DPWM is its simplicity and linearity. For a reasonable DPWM resolution, however, the number of bits of the counter, n, is large in value. Therefore, the required clock frequency $f_{clk}$ can be unreasonably high. In a 10-bit DPWM implementation with a switching frequency $f_{sw}=1$ MHz, for example, the required clock frequency, $f_{clk}$ is approximately 1 GHz. This makes the implementation of a high-resolution, high-frequency counter-based DPWM a difficult task.

Another implementation of a DPWM is a delay-line DPWM. In a pure delay line DPWM, a delay line is used to resolve the output modulated signal. While a high resolution pure delay line DPWM requires a relatively larger area and more hardware resources than a counter-based DPWM, the pure delay line DPWM can be operated with a much lower clock frequency than a counter-based DPWM.

A hybrid DPWM is a compromise between a high clock frequency of a counter-based DPWM and a large area requirement of a pure delay line DPWM. A hybrid DPWM, for example, provides a high resolution, high frequency DPWM without a need for a relatively high input clock frequency, as in a counter-based DPWM, or a relatively large area, as in a pure delay-line based DPWM.

Different topologies of hybrid DPWM have been introduced, such as a ring-oscillator DPWM without any external clock and open-loop delay-line DPWM with an external clock. A hybrid DPWM with an open-loop delay-line is based on a combination of a counter and a delay-line. The counter, for example, may provide a most-significant-bit (msb) or a least-significant-bit (lsb) portion of the duty cycle of the modulator. FIG. 1 shows an example of a hybrid DPWM 10, with a counter 12 and an open-loop delay line 14. The DPWM, in this example, is a 5-bit DPWM with a three-bit counter providing a three msb portion 16 of a duty cycle command and a two-bit delay line providing a two-bit lsb portion 18 of the duty cycle command.

As shown in FIG. 1, the counter 12 is an n-bit counter that counts at each clock period of the clock input signal, clk, to provide a counter output, cnt. The counter output cnt is compared to the three-bit msb portion 16 of the duty cycle command at a comparator 20. An output of the comparator 20, delclk, is provided to the open-loop delay-line 14. The number of delay cells, L, required in the delay-line 14 depends upon the number of bits provided by the delay-line, l, in the hybrid DPWM. In this example, the delay-line provides l=2 bits of the duty cycle command, and the number of delay cells required $L=2^l=2^2=4$. Thus, the open-loop delay-line 14 includes four sequential delay cells $del_0$, $del_1$, $del_2$, and $del_3$.

An L:1 multiplexer 22 taps the nodes after each of the delay cells $del_0$, $del_1$, $del_2$, and $del_3$ at inputs $i_0$, $i_1$, $i_2$, and $i_3$, respectively. The multiplexer 22 receives the two-bit lsb portion 18 of the duty cycle command and uses that portion to select one of the inputs connect the appropriate input $i_0$, $i_1$, $i_2$, or $i_3$ to the output R. The output R of the multiplexer 22 is then provided to a flip-flop 24 that then provides an output, DPWM_out.

A counter stage comprises the counter 12 and the comparator 20. The delay-line stage comprises the delay-line 14, the multiplexer 22, and the flip-flop 24.

FIG. 2 shows a timing diagram for the hybrid DPWM 10 shown in FIG. 1. In this example, the clock input signal clk is shown at the top of the timing diagram. The counter output cnt is shown just below the clock input signal clk and provides a three-bit binary counter starting at 000 and resetting itself after eight clock cycles at 111. In the example shown in FIG. 2, the duty cycle command, duty, received by the hybrid DPWM 10 is duty=10110. Thus, the three-bit msb portion 16 is msb(duty)=101 and the two-bit lsb portion 18 is lsb(duty)=10.

As described above, the counter output cnt is compared to the three-bit msb portion 16 of the duty cycle command msb(duty) at the comparator 20 to provide the resulting delclk signal shown in the timing diagram of FIG. 2. The width of the delclk signal is equivalent to one clock period of the input clock signal clk. The signal delclk is then propagated through the delay-line 14. The output of each delay cell is tapped out and connected to the L:1 multiplexer 22. The propagated signals $i_0$-$i_3$, from the output of the delay cells $del_0$-$del_3$ are also shown in the timing diagram of FIG. 2. In this example, the lsb portion of the duty cycle command lsb(duty)=10 (i.e., binary 2). Thus, the input $i_2$ of the multiplexer 22 is selected and connected to the output R of the multiplexer. The signal R resets the output DPWM_out of the flip-flop 24.

The frequency of the output signal DPWM_out of the hybrid DPWM 10 is still determined by the formula (1) $f_{clk}=2^n f_{sw}$ given above, where n is the number of bits of the counter. Because a smaller n is used in a hybrid DPWM, the required input clock frequency is lower in value for a hybrid DPWM compared to a counter-based DPWM even though it provides the same DPWM resolution. In the example of FIGS. 1 and 2, for example, the required input clock frequency is four times smaller than an equivalent counter-based DPWM.

Digital Pulse-Width-Modulators with delay lines are used in many applications. In DC-DC power converters, for example, digital controllers include custom architectures and realizations of building blocks including high-resolution, high-frequency, digital pulse-width modulators (DPWM), simplified discrete-time compensator schemes, and analog-to-digital (A/D) converters. Digital controllers can also offer advantages of lower sensitivity to parameter variations, programmability, and reduction or elimination of passive components, often without compromising dynamic performance, simplicity, or cost.

BRIEF SUMMARY

Even for a very careful delay line design, delays of individual cells within the delay line vary with process, temperature, and input voltage variations. Such changes in the duration of delays introduced by the delay line, for example, can affect the operation of a pulse-width-modulator in which the delay line is used, such as by introducing non-linear and non-monotonic behavior.

One or more discretely adjustable delay cells can be used to adjust the delay through the delay line. In addition, an active control scheme can be used to control the delay through at least one individual delay cell of the delay-line. A delay of at least one delay cell in the delay line can be controlled in order to account for such variances, however.

In one implementation, a controllable delay line may be used to guarantee monotonic and near optimum behavior of a DPWM including a delay line (e.g., a hybrid or pure delay line DPWM). In this particular implementation, the total delay of the delay line can be controlled to be approximately equal to one clock period of the input clock.

In another particular implementation, a hybrid digital pulse width modulator (DPWM) with digital delay-locked loops (DLLs) is provided. In this implementation, the digital pulse-width-modulator is synthesizable and includes a digital delay-locked loop around a delay-line to achieve constant frequency clocked operation. In this implementation, the resolution of the modulator is consistent over a wide range of process or temperature variations. The DPWM may implement trailing-edge, leading-edge, triangular, or phase-shift modulation. In an implementation suitable for DC-DC converters with synchronous rectifiers, for example, the DPWM may include two or more outputs for programmable dead-times. The DPWM may further be implemented in FPGA or custom chip modules.

In another implementation, a digital pulse-width modulator is provided. The digital pulse-width modulator comprises a delay line, a multiplexer, and a controller. The delay line comprises an input for receiving an input signal and a plurality of delay cells connected in series. The plurality of delay cells comprises at least two discretely adjustable delay cells, and the delay line is configured to propagate the input signal through the plurality of delay cells. The multiplexer comprises a plurality of inputs and an output. Each of the plurality of inputs of the multiplexer is coupled to an output of one of the plurality of delay cells of the delay line. The output of the multiplexer is selected from the plurality of inputs of the multiplexer based upon at least a portion of a duty cycle command. The controller is coupled to outputs of at least two delay cells in the delay line. The controller samples the outputs at the end of a reference period to obtain a first sampled discrete value and a second sampled discrete value. The controller further compares the first discrete value to the second discrete value and determines a digital control code for discretely and independently adjusting a delay of the discretely adjustable delay cells based upon the comparison of the first discrete value to the second discrete value.

In yet another implementation, a hybrid digital pulse-width-modulator (DPWM) is provided. The hybrid DPWM comprises a counter stage, an adjustable delay line stage, a multiplexer, and a controller. The counter stage comprises a counter for providing a count signal, and a comparator coupled to the counter to receive the count signal. The comparator is configured to receive a first portion of a duty cycle command and to provide a counter stage output signal based on the count signal and the first portion of the duty cycle command. The adjustable delay line stage comprises a plurality of delay cells configured in series. At least two of the plurality of delay cells comprise a discretely adjustable delay cell with a digital adjustment input. A first delay cell of the plurality of delay cells is coupled to the counter stage to receive the counter output signal. The multiplexer comprises at least two data inputs coupled to the outputs of at least two of the plurality of delay cells and a selector input for receiving a second portion of the duty cycle command. The multiplexer outputs an input signal received at one of the data inputs based upon the second portion of the duty cycle command. The controller is coupled to an input of the plurality of delay cells to receive the counter stage output signal and to an output of at least one of the plurality of delay cells to receive a delayed signal. The controller is configured to generate a digital adjustment signal to discretely and independently control a delay of the discretely adjustable delay cells via the digital adjustment input of the discretely adjustable delay cells based upon a comparison of the counter stage output signal and the delayed signal.

In another implementation, a method for controlling a delay of a delay line of a digital pulse-width-modulator is provided. The method comprises: receiving a signal at a delay line of the digital pulse-width-modulator; propagating the signal through a plurality of delay cells of a delay line, at least two of the plurality of delay cells comprising a discretely adjustable delay cell; providing an output of at least two of the plurality of delay cells of the delay line to a multiplexer; selecting one of the outputs of the delay cells at the multiplexer based at least a portion of a duty cycle command; sampling the signal at the end of a reference period at an output of a first delay cell in the delay line and an output of a second delay cell in the delay line to obtain a first sampled discrete value and a second sampled discrete value; comparing the first discrete value to the second discrete value; determining a digital control code for discretely and independently adjusting a delay of the at least two discretely adjustable delay cells based upon the comparison of the first discrete value to the second discrete value; and applying the digital control code to the at least two discretely adjustable delay cell to adjust a delay of the discretely adjustable delay cell.

In yet another implementation, a digital pulse-width-modulator with a digital phase-locked loop is provided. The digital pulse-width-modulator comprises a ring oscillator, a phase/frequency detector, a controller, a multiplexer, and a comparator. The ring oscillator comprises a plurality of delay cells. At least two of the delay cells comprising a discretely adjustable delay cell. The phase/frequency detector is coupled to an output of the ring oscillator. The phase/frequency detector compares a phase and a frequency of the ring oscillator output to a phase and a frequency of a reference clock and generates a pair of digital error signals. The controller is coupled to the discretely adjustable delay cells of the ring oscillator to discretely and independently control a delay of the discretely adjustable delay cells via a digital control command. The digital controller generates the digital control command based on the pair of digital error signals. The multiplexer comprises a plurality of inputs coupled to the plurality of delay cells of the ring oscillator and an output for providing a multiplexer output signal corresponding to one of the plurality of inputs. The multiplexer output signal is selected from the plurality of inputs based upon a first portion of a duty cycle command. The comparator comprises a pair of inputs for receiving a counter signal and a second portion of the duty cycle command and an output. Course adjustment of an output pulse width of the digital pulse-width modulator is based on the output of the comparator. Fine adjustment of the output pulse width of the digital pulse-width modulator is based on the multiplexer output signal.

The foregoing and other aspects, features, details, utilities, and advantages of the present invention will be apparent from reading the following description and claims, and from reviewing the accompanying drawings.

DETAILED DESCRIPTION

A digital pulse-width-modulator (DPWM) including a discretely adjustable delay line is provided. The discretely adjustable delay line of the DPWM may be used, for example, to compensate for delay variations introduced by process, temperature, and/or input voltage variations. The DPWM may comprise any type of DPWM that uses a delay line, such as a pure delay line DPWM, a hybrid DPWM, or a ring oscillator type hybrid DPWM.

Figure 3A:
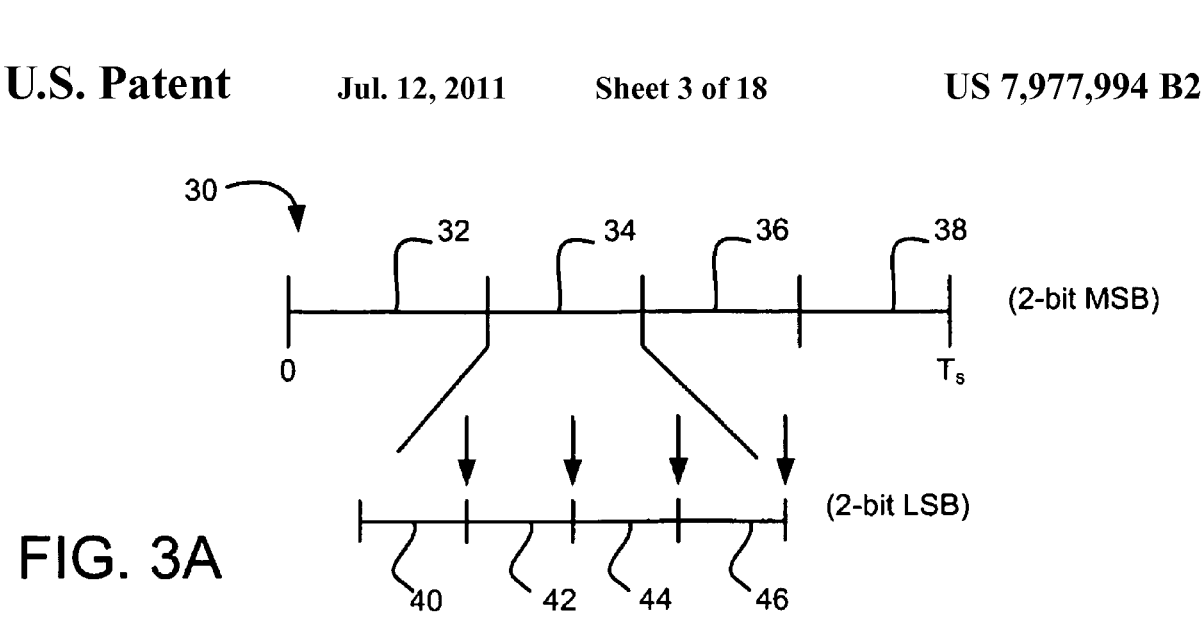
FIGS. 3A through 3C shows timing diagrams of an output from a four-bit hybrid digital pulse-width-modulator.

FIG. 3A shows an ideal timing diagram 30 of an output from a four-bit hybrid DPWM in which the most-significant bit (msb) portion of the duty cycle command is resolved by a counter-based portion of the hybrid DPWM and a least-significant-bit (lsb) portion of the duty cycle command is resolved by a delay line portion of the hybrid DPWM. In this example, the msb portion comprises two-bits of the four-bits of the overall hybrid DPWM, and the lsb portion comprises the remaining two-bits. The overall switching period from time 0 to time $T_s$ is divided into four increments 32, 34, 36, and 38 corresponding to the two-bit msb portion of the duty cycle command that is resolved by the counter-based portion of the hybrid DPWM. Specifically, the first increment 32 ranges from 0 to $T_s/4$, the second increment 34 ranges from $T_s/4$ to $T_s/2$, the third increment 36 ranges from $T_s/2$ to $3 \cdot T_s/4$, and the fourth increment ranges from $3 \cdot T_s/4$ to $T_s$.

In the example shown in FIG. 3A, the second increment 34 is expanded below the timing line to show the portion of the timing diagram corresponding the remaining two-bit lsb potion of the duty cycle command that is resolved via the delay line portion of the hybrid DPWM. Similar to the upper portion of the timing diagram corresponding to the msb portion of the duty cycle command, the lower portion of the timing diagram corresponding to the lsb portion of the duty cycle command is divided into four time slots 40, 42, 44, and 46. In the ideal hybrid DPWM, each of the time slots 40 to 46 corresponding to the delay line portion of the hybrid DPWM are equal to each other and result in a linear and monotonic modulated signal output from the hybrid DPWM.

Figure 3B:
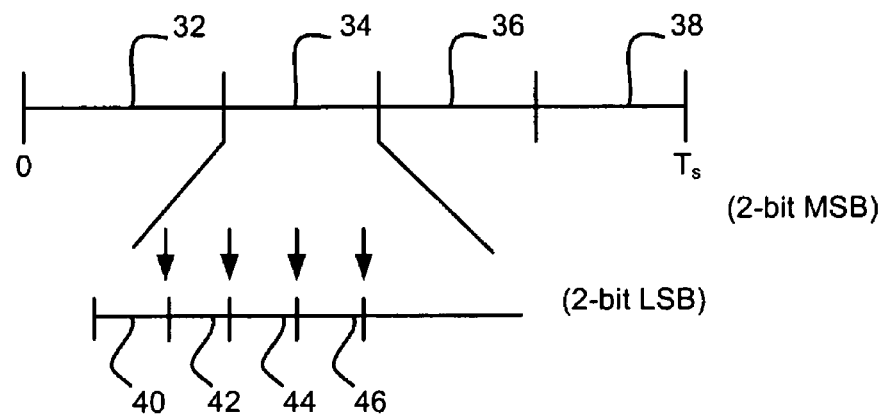
Figure 3C:
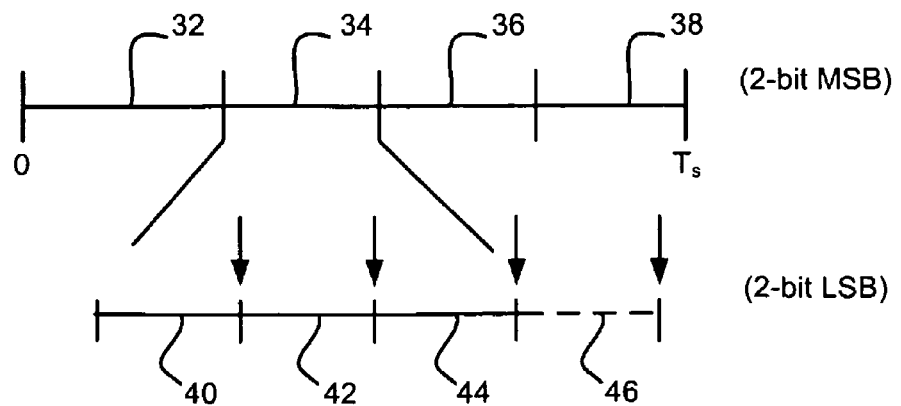

In contrast to the ideal delays provided by the cells in the delay line shown in the timing diagram of FIG. 3A, typical delay cells are strongly dependent on factors such as process and temperature variations. FIGS. 3B and 3C, for example, shows timing diagrams from a four-bit hybrid DPWM in which the delay in cells of the delay line are able to vary, such as with process and/or temperature variations. In FIG. 3B, for example, the delays of the individual cells of the delay line are shorter than the delays provided by the delay cells shown in FIG. 3A. In FIG. 3C, however, the delays of the individual cells of the delay line are longer than the delays provided by the delay cells shown in FIG. 3A.

As described above with respect to FIG. 3A, FIGS. 3B and 3C both show time increments 32, 34, 36, and 38 corresponding to the two-bit the most-significant bit (msb) portion of a duty cycle command that is resolved by a counter-based portion and time slots 40, 42, 44, and 46 corresponding to the two-bit least-significant-bit (lsb) portion that is resolved by a delay line portion of the hybrid DPWM. Again, the msb portion comprises two-bits of the four-bit duty cycle command, and the lsb portion comprises the remaining two-bits.

In the example shown in FIG. 3B, time slots shown in the expansion of the second increment 34 below the timing line show resolution of the remaining two-bit lsb potion of the duty cycle command via the delay line where the delays of the individual cells are each less than one-fourth of the total increment 34. In this configuration, the shorter delays provided by the delay cells provide a non-linear output from the hybrid DPWM because the duration of each time slot within the increment 34 is not equal. The output of the hybrid DPWM is monotonic, however, because the delay through the delay line is not greater than the total time allocated to the increment 34.

In FIG. 3C, however, the time slots shown in the expansion of the second increment 34 below the timing line show resolution of the remaining two-bit lsb potion of the duty cycle command via the delay line where the delays of the individual cells are each greater than one-fourth of the total increment 34. In this configuration, the longer delays provided by the delay cells provide a linear output if the delays of each cell in the delay line are the same. However, the output of the hybrid DPWM is non-monotonic because delay through the delay line is greater than the time allocated for the increment 34. Thus, the output of the delay line extends into the third increment 36 of the counter portion of the hybrid DPWM and can lead to output signals that overlap.

Although FIGS. 3A through 3C shows timing diagrams for a hybrid DPWM, one skilled in the art would recognize that similar timing concerns would also apply in a pure delay line DPWM configuration.

Figure 4A:
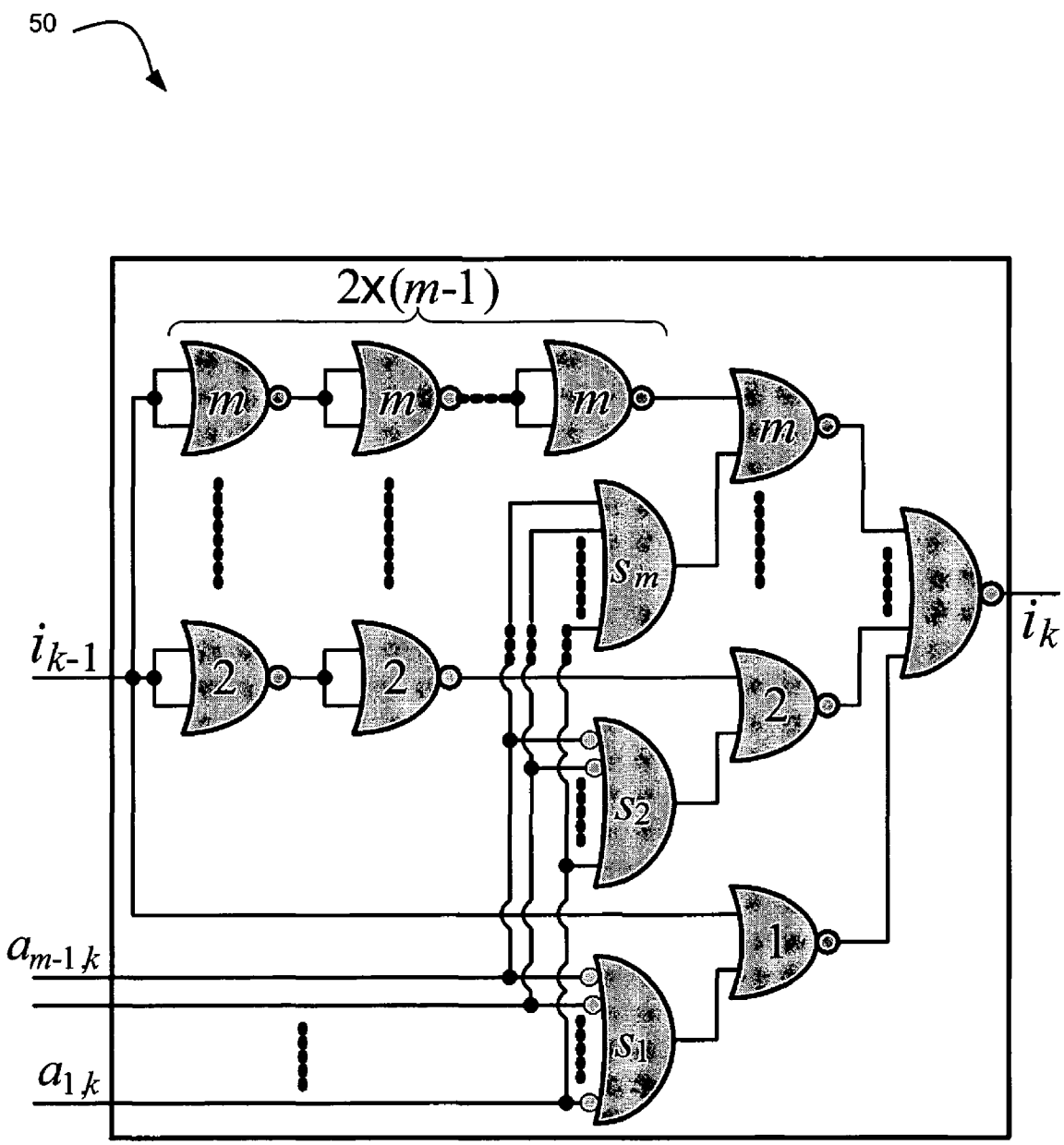
FIGS. 4A and 4B show implementations of discretely adjustable delay cells.

FIG. 4A shows an implementation of a discretely adjustable delay cell 50A. The delay through the individual delay cell is discretely adjustable to control the delay of a delay line. Where each delay cell in the delay line is adjustable, for example, the delay of the entire delay line can be controlled. The delay line may also comprise a subset of one or more discretely adjustable delay cells that may be discretely controlled to compensate for variations of delays in the delay line. The discretely adjustable delay cell 50A is the $k_{th}$ cell of the delay line. The discretely adjustable delay cell 50A can be adjusted with a ratio of 1:2. Within the delay cell 50A, there are two parallel branches 52A that connect an input $i_{k-1}$ of the delay cell 50A to the output $i_k$ of the delay cell 50A. If the first branch has a delay of $\Delta t$, the second branch of the delay cell has a delay of $2\Delta t$. A control line $a_{k-1}$ can be assigned a thermometer code to select the appropriate delay branch 52A of the delay cell 50A to provide a desired delay through the delay cell 50A. The input control signals can be provided, for example by a delay control module that controls at least one of the delay cells within a delay line.

Figure 4B:
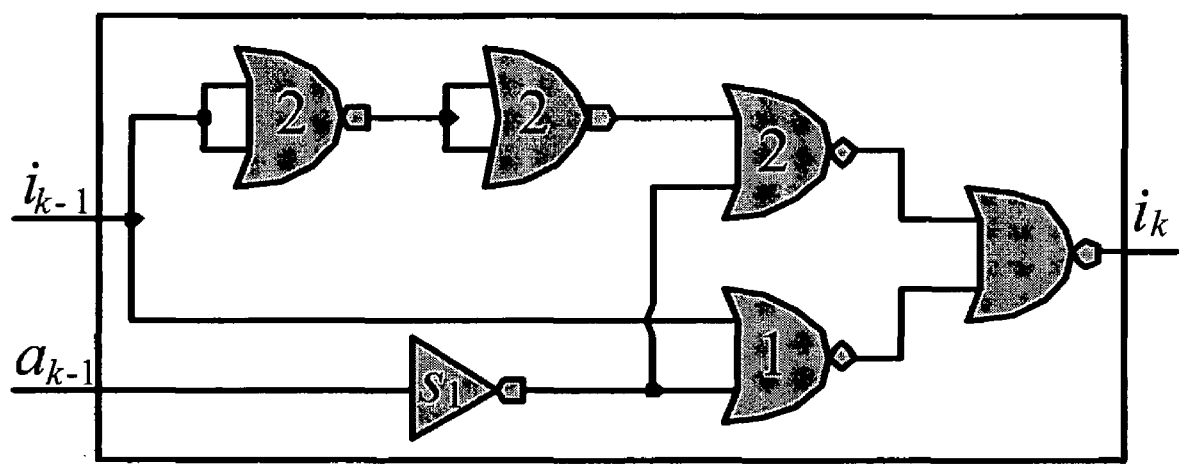

FIG. 4B shows another implementation of a discretely adjustable delay cell 50B. The delay through the individual delay cell 50B is discretely adjustable to control the delay of a delay line. Where each delay cell in the delay line is discretely adjustable, for example, the delay of the entire delay line can be controlled. The delay line may also comprise a subset of one or more discretely adjustable delay cells that may be discretely controlled to compensate for variations of delays in the delay line. In FIG. 4B, the discretely adjustable delay cell 50B is the $k_{th}$ cell of the delay line. In this implementation, the discretely adjustable delay cell 50B can be adjusted with a ratio of 1:m. Within the delay cell 50B, there are m parallel branches 52B that connect the input $i_{k-1}$ of the delay cell to the output $i_k$ of the delay cell 50B. If the first branch has a delay of $\Delta t$, the $m_{th}$ branch of the delay cell has a delay of $m\Delta t$. The control lines $a_{1,k}$ to $a_{m-1,k}$ can be assigned a thermometer code to select an appropriate delay branch 52B of the cell 50B to provide a desired delay through the delay cell 50B. The input control signals can be provided, for example, by a delay control module that controls at least one of the delay cells within a delay line.

Figure 1:
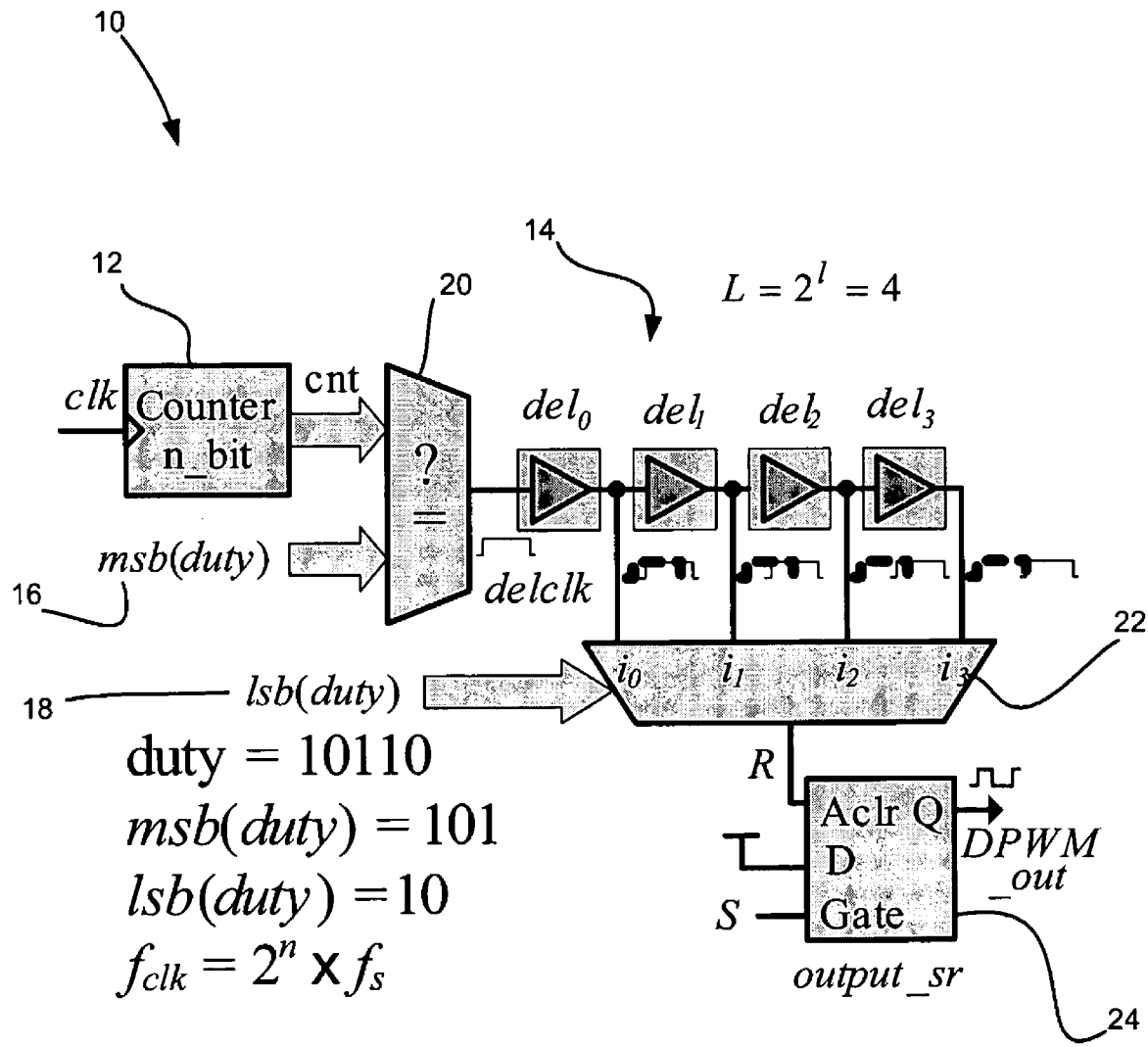
FIG. 1 shows an example of a hybrid digital pulse-width-modulator with a counter and an open-loop delay line.
Figure 2:
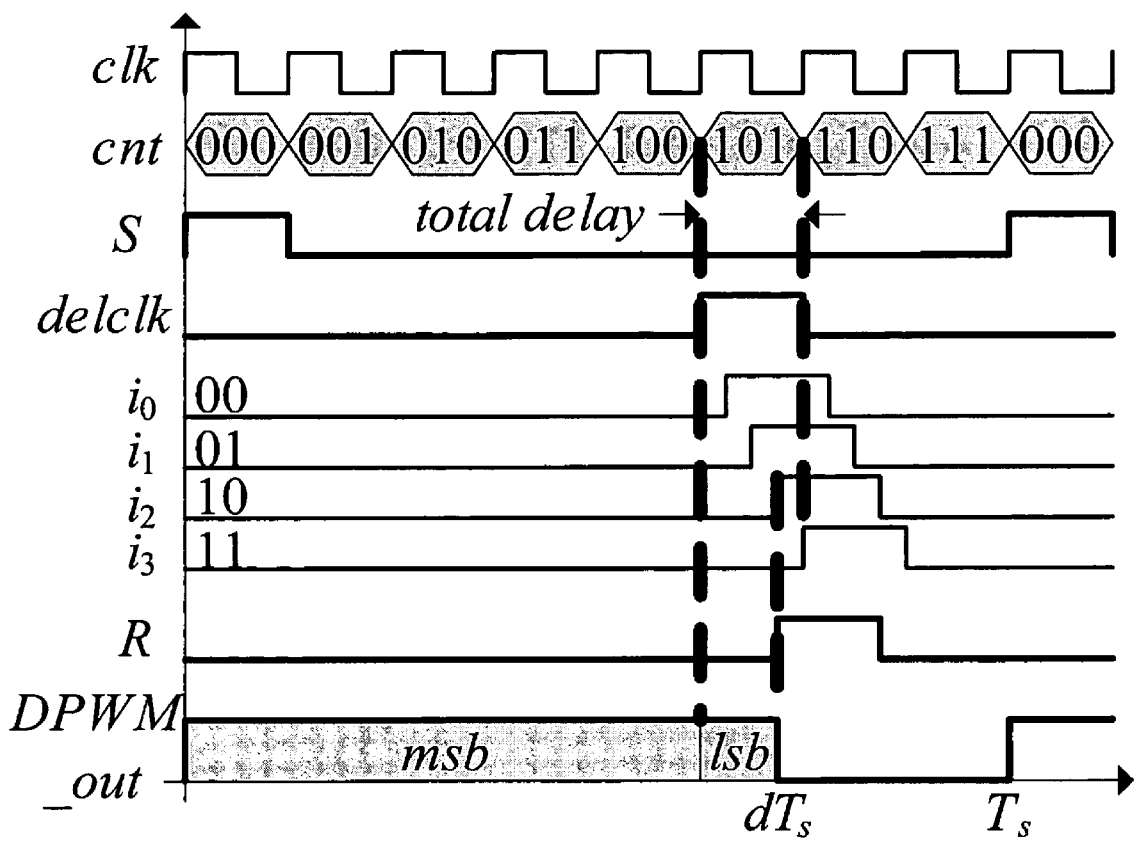
FIG. 2 shows a timing diagram for the hybrid DPWM 10 shown in FIG. 1.
Figure 5:
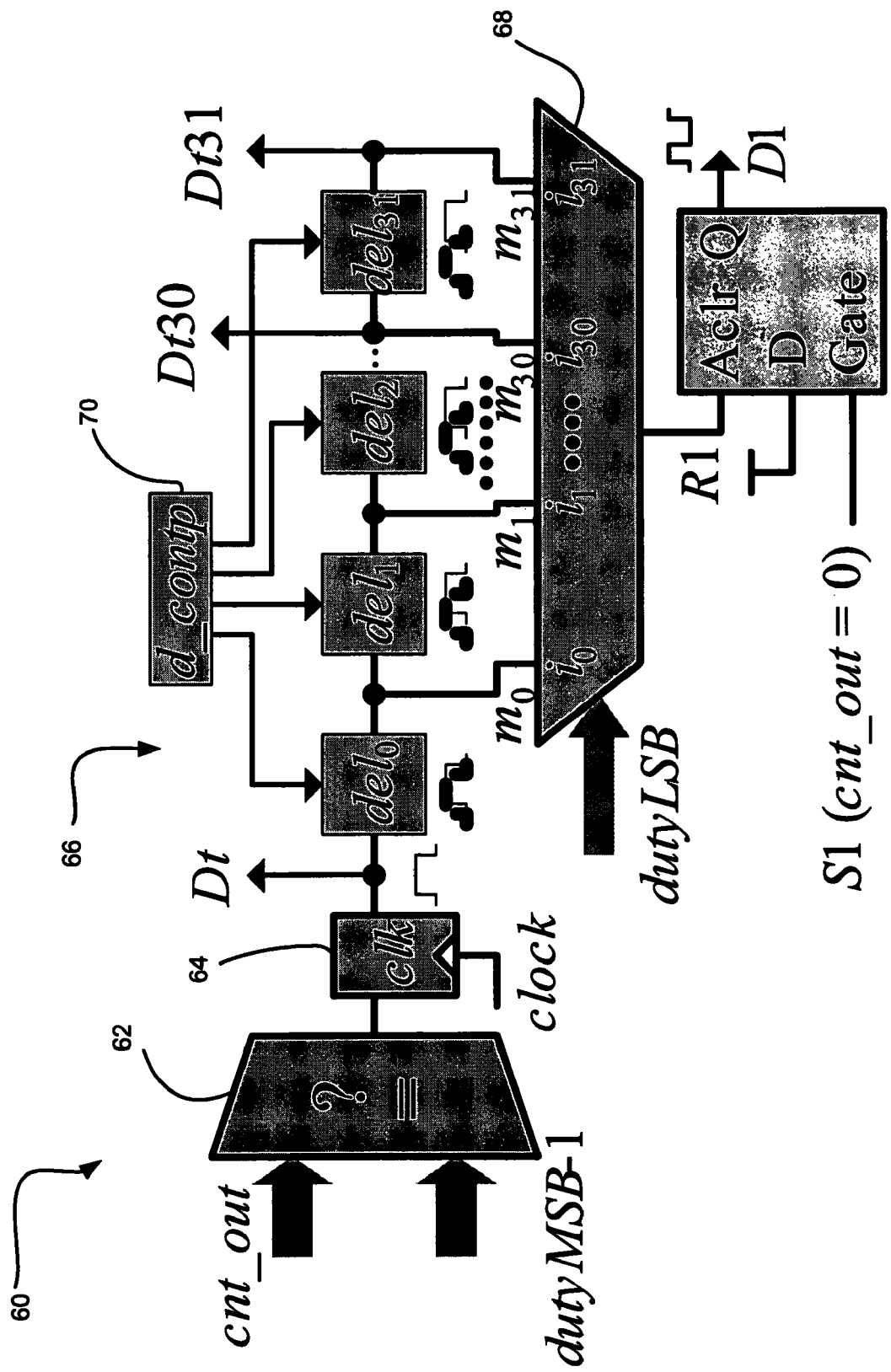
FIG. 5 shows an implementation of a hybrid digital pulse-width-modulator configured to discretely adjust a delay of one or more delay cells in a delay line.

FIG. 5 shows an implementation of a hybrid DPWM 60 configured to discretely adjust a delay of one or more delay cells in the delay line. The overall structure of the hybrid DPWM 60 is similar to the hybrid DPWM 10 shown in FIG. 1, except one or more of the delay cells have a discretely adjustable delay controlled by the digital delay control signal(s) d_contp. The hybrid DPWM 60 receives a count signal cnt_out output from a counter and compares the count signal cnt_out with the modified duty cycle command msb (duty)−1 in a comparator 62. The output of the comparator 62 is provided to a flip-flop 64 that secures the signal and prevents inconsistencies that might be introduced by combinatorial logic of the comparator 62. To compensate for the delay introduced by the flip-flop 64, the most-significant-bit portion msb(duty) of the duty cycle command is modified by subtracting one (corresponding to the delay of the flip-flop). The signal is then provided to a delay line 66. In this particular implementation, for example, the delay line comprises 32 discretely adjustable delay cells corresponding to a five-bit resolution.

As described above with respect to FIG. 1, the outputs of each delay cell in the delay line 66 are tapped and provided to inputs of a multiplexer 68. An input of the multiplexer is selected using the least-significant-bit portion duty LSB of the duty cycle command as described above with respect to FIG. 1.

The outputs of the flip-flop 64, the second last delay cell $del_{30}$, and the last delay cell $del_{31}$, are tapped to provide the respective signals Dt, $Dt_{30}$, and $Dt_{31}$. These signals are provided to a delay locked loop (DLL) controller 70 to control the delay of one or more of the discretely adjustable delay cells of the delay line 66. As shown above in FIG. 3A, the ideal delay through the delay line should be equivalent to a width of the Dt signal received at the input of the delay line 66. Thus, a falling edge of the input signal Dt should be aligned with the rising edge of the output signal $Dt_{31}$. In the DLL controller 70, a flip-flop may be used to detect a misalignment of edges of the input and output signals. If at a falling edge of the input signal Dt, a high value for the output signal $Dt_{31}$ is detected, the delay of the delay line may be increased, and if at the falling edge of the input signal Dt, a low value for the output signal $Dt_{31}$ is detected the delay of the delay line may be decreased.

Figure 6:
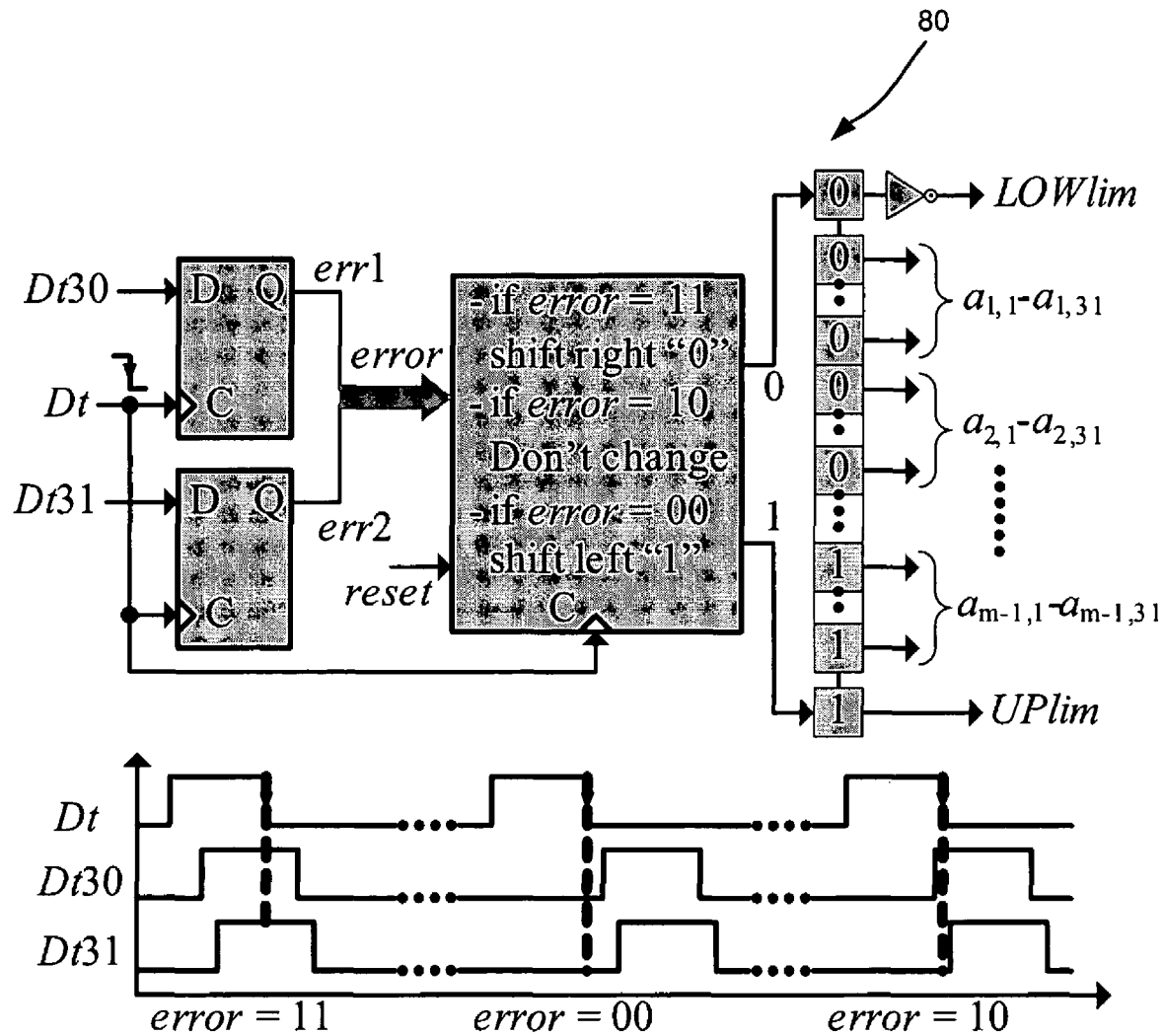
FIG. 6 shows one implementation of a shift register used to provide digital delay control signals for adjusting a delay of delay cells of a digital pulse-width-modulator.

In one particular implementation shown in FIG. 6, a shift register 80 is used to provide the digital delay control signals and adjust the delay of the delay cells. To increase the delay through the delay line a zero may be shifted to the left, and to decrease the delay through the delay line a one is shifted to the right. Other implementations are possible, however. In this implementation, the output of the shift register is then a thermometer coded signal that can be used to control the delay of one or more of the individual delay cells of the delay line.

In this particular implementation, to have a steady-state condition and prevent jittering on the output of the hybrid DPWM, the falling edge of the input signal Dt is compared with the rising edges of both tapped signals $Dt_{30}$ and $Dt_{31}$. In this implementation, the change in the control value of the shift register is performed until the falling edge of the input signal Dt falls between the rising edges of the signals $Dt_{31}$ and $Dt_{31}$. After the error=10 (see FIG. 6), is achieved, no further change in the shift register need be performed, and a steady-state situation for the delay of the delay line may be achieved.

The total number of bits in the shift register depends on the number of discretely adjustable delay cells in the delay line and the delay cell adjustment ratio. If l is the number of discretely adjustable delay cells in the delay line and the individual discretely adjustable delay cells each have an adjustment ratio of 1:m, the total number of bits required to adjust each cell in the delay line is $2^l \cdot (m-1)$. In a five-bit delay line with a delay adjustment ratio of 1:4, for example, three sets of 32-bit shift registers may be used to digitally adjust a delay of each cell in the delay line. Two more bits, $LOW_{lim}$ and $UP_{lim}$, may be added at the beginning and the end of the shift register, respectively, to indicate if the delay line has reached its minimum or maximum achievable delay. Furthermore, it shows that the DLL cannot satisfy the requirement of having a falling edge of the input signal Dt to be aligned with the output signal $Dt_{31}$ (i.e., the error signal is always 11 or 00 in the implementation shown in FIG. 6).

The digital control signals at the output of the shift register 80 can be connected to control inputs of the discretely adjustable delay cells in different ways. Although the connection of the control signal can be a direct connection (e.g., the bits of the thermometer code of the control signal can be connected linearly to the control inputs of the adjustable delay cells), the control signal can alternatively be connected in a connection pattern (e.g., a connection pattern that increases the linearity of the DPWM). The least linear output of the DPWM will occur when all the low or high delay modules are placed together (e.g., at the beginning or end of the delay line).

Figure 7:
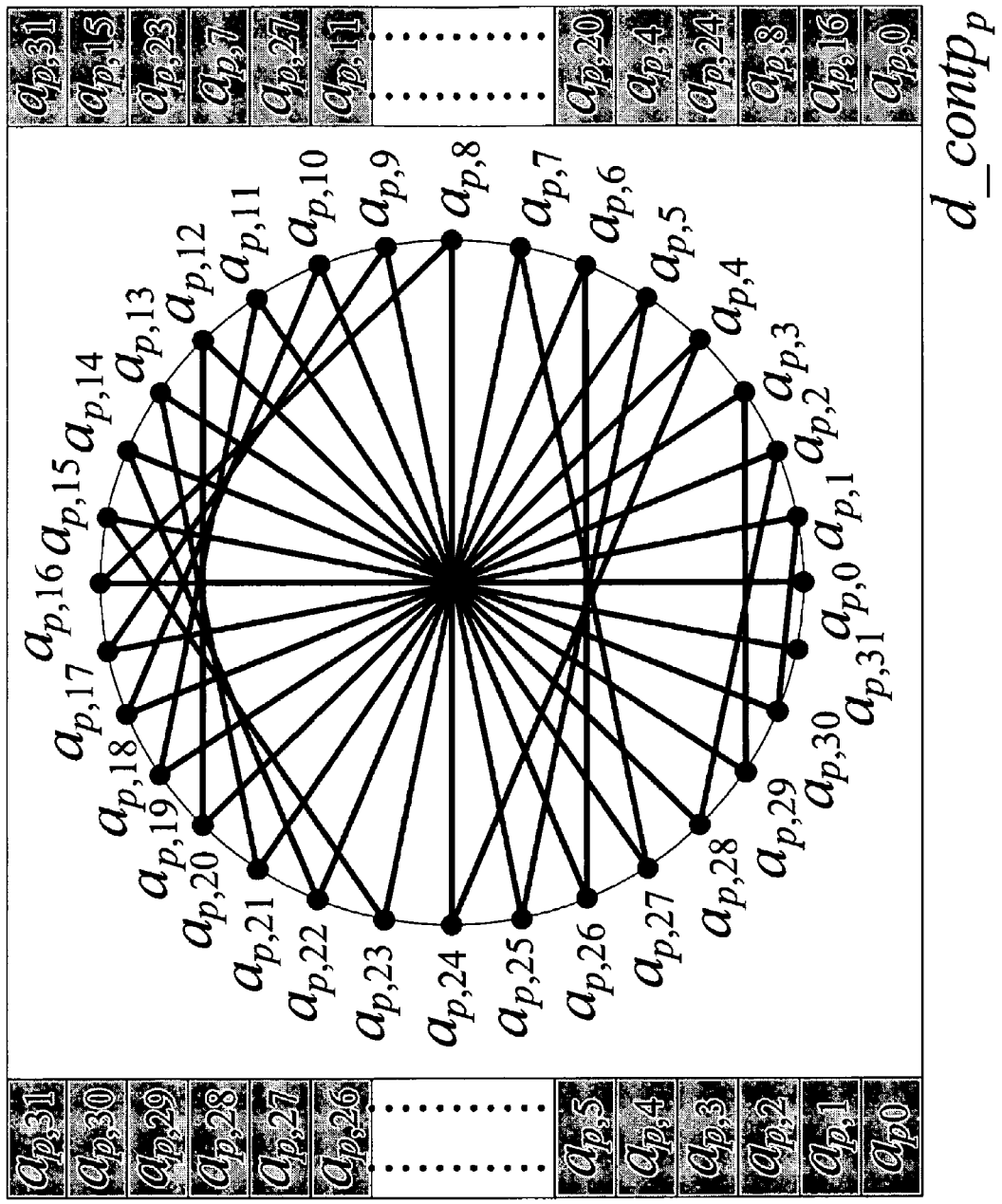
FIG. 7 shows an implementation of a connection pattern for applying a digital control signal to a plurality of discretely adjustable delay cells.

In an ideal design, half of the discretely adjustable delay cells are adjusted at a low delay value, and the other half of the discretely adjustable delay cells are adjusted at a high delay value. Therefore, the maximum linearity for this ideal case can be achieved by arranging the discretely adjustable delay cells consecutively in the delay line. For any number of the delay cells, a connection pattern can be derived that provides consecutive arrangements of delay. For a five-bit delay line with thirty-two discretely adjustable delay cells, for example, a connection pattern for the $p^{th}$ of the m−1 sets of the shift register output is shown in FIG. 7. The output of the pattern module is then connected to the delay cell control input shown in FIG. 4.

Figure 8:
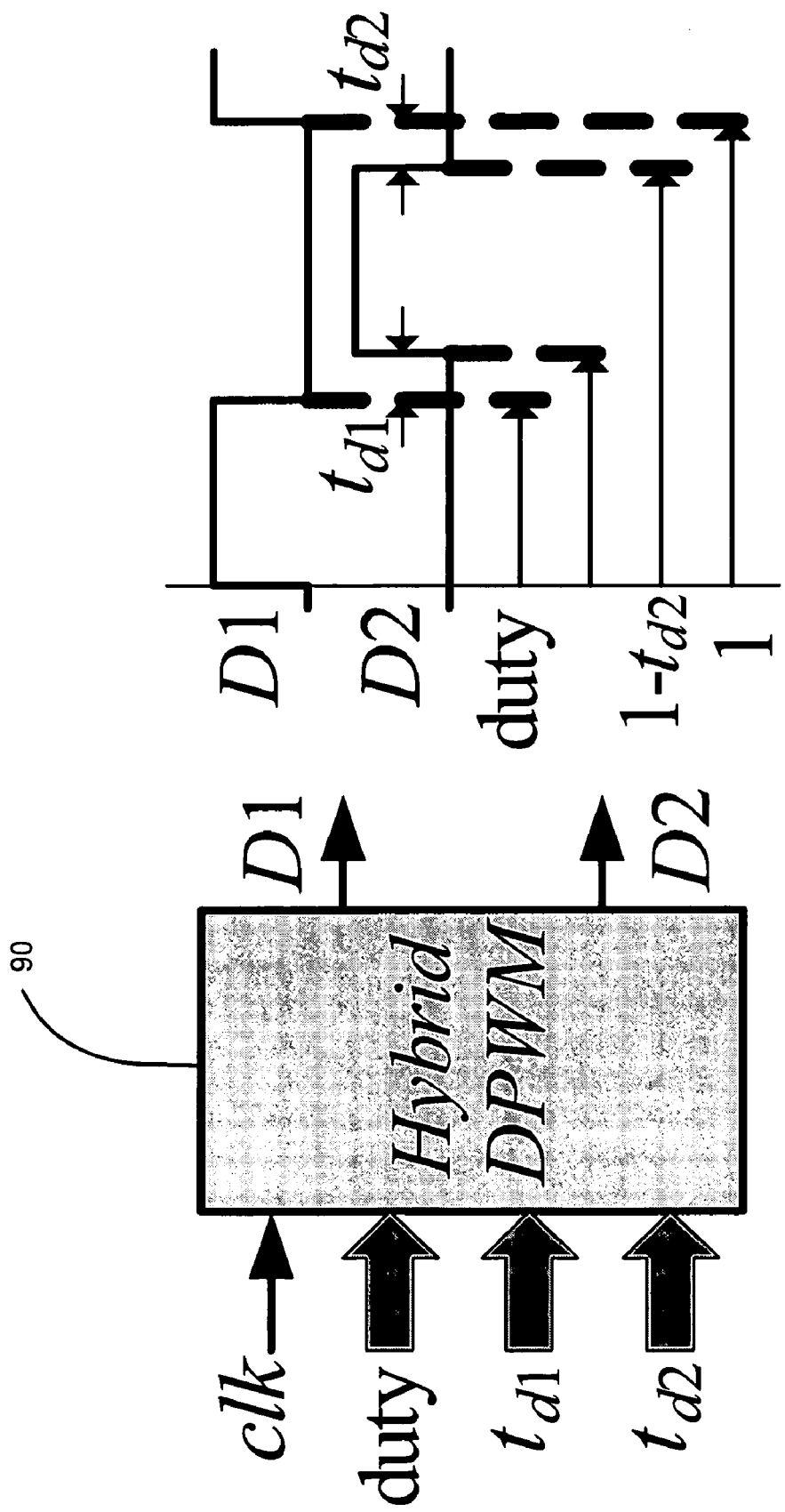
FIG. 8 shows an example of a hybrid digital pulse-width-modulator module providing two outputs.

A DPWM may provide one or more outputs. Examples of circuits that may need multiple outputs as control signals include a synchronous buck DC-DC converter or a converter that requires a phase shift. FIG. 8 shows an example of a hybrid DPWM module 90 providing two outputs $D_1$ and $D_2$. The dual output hybrid DPWM module 90 may be used, for example, in a DC-DC converter with a synchronous rectifier in which the outputs $D_1$ and $D_2$ are used to provide programmable dead-times for the synchronous rectifier.

Figure 9:
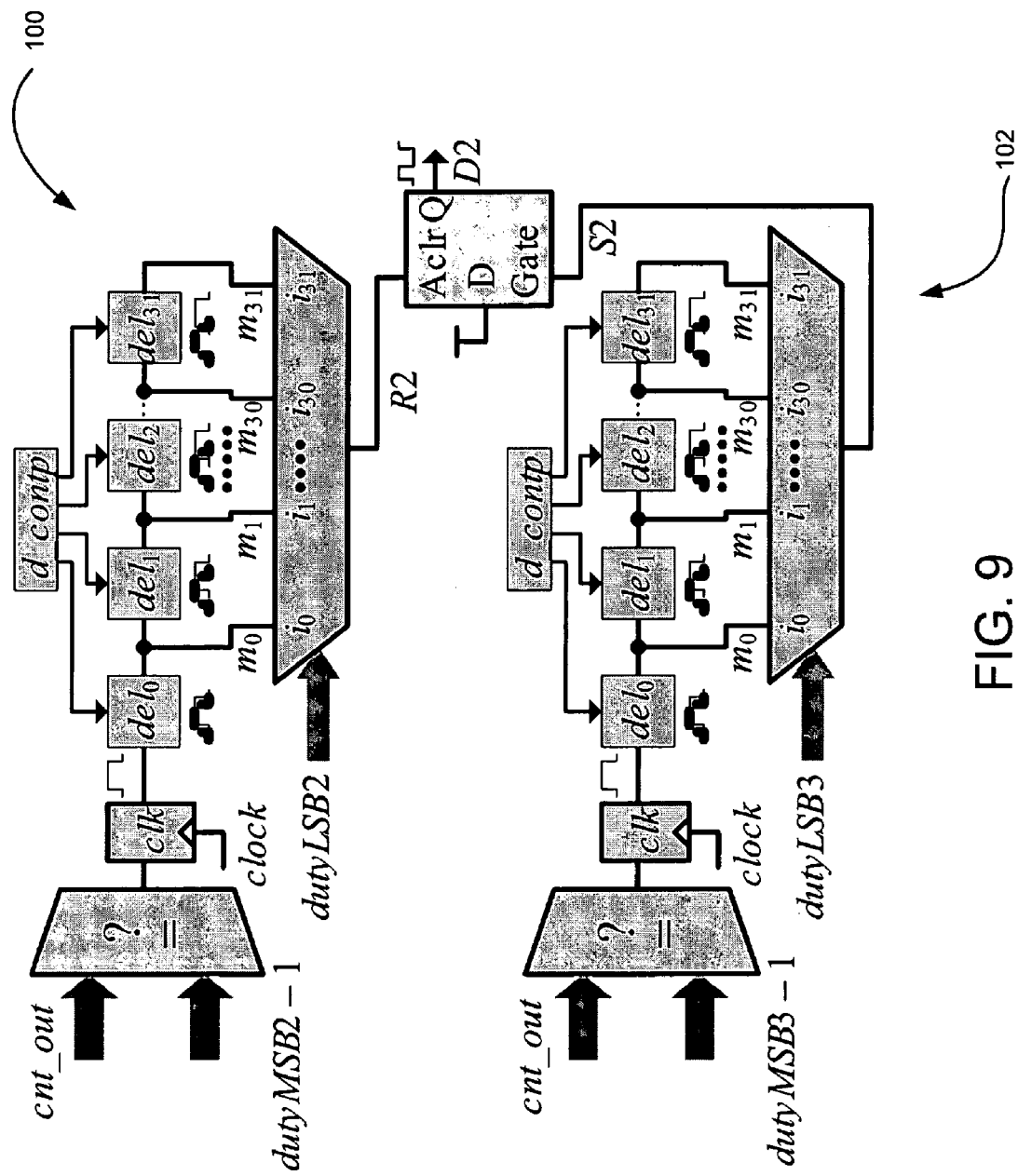
FIG. 9 shows one implementation of a hybrid digital pulse-width-modulator stage for producing the second output of the hybrid digital pulse-width-modulator shown in FIG. 8.
Figure 10:
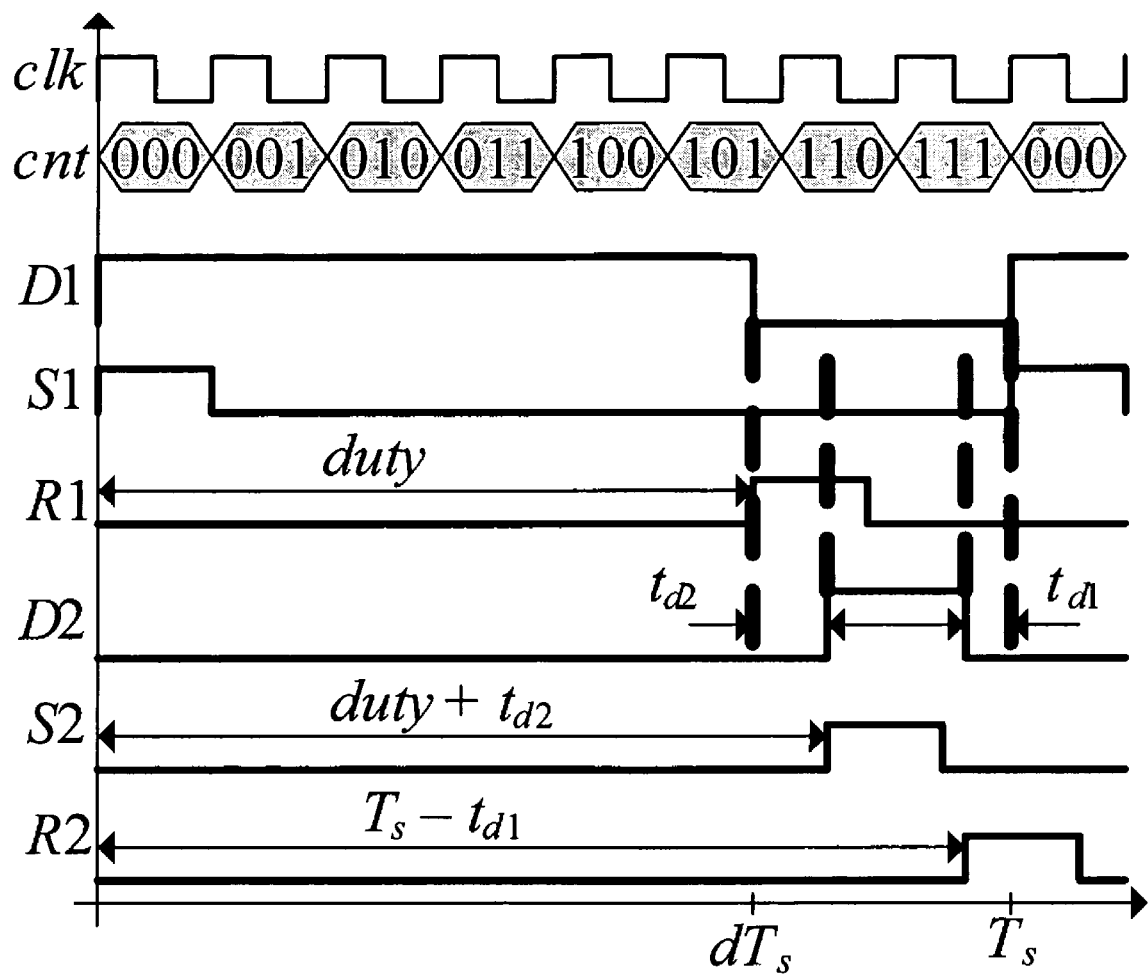
FIG. 10 shows a timing diagram for an example hybrid digital pulse-width-modulator.

FIG. 9 shows two delay lines 100 and 102 that together produce the second output of the hybrid DPWM 90 shown in FIG. 8, $D_2$. The structure of each of the delay lines 100 and 102 is similar to the structure of the single delay line 60 shown in FIG. 5. FIG. 10 shows a timing diagram for an example hybrid DPWM that has a combination of a two-bit counter and an l-bit delay line. In this example, a set point of the output signal $D_1$, signal $S_1$, is always fixed and happens at a time when a counter is zero. A reset point $R_1$, on the other hand, may occur at any time between one clock period of an input signal clk. Therefore, a single delay line can be used to generate the signal $D_1$, as shown in FIG. 5.

Figure 12:
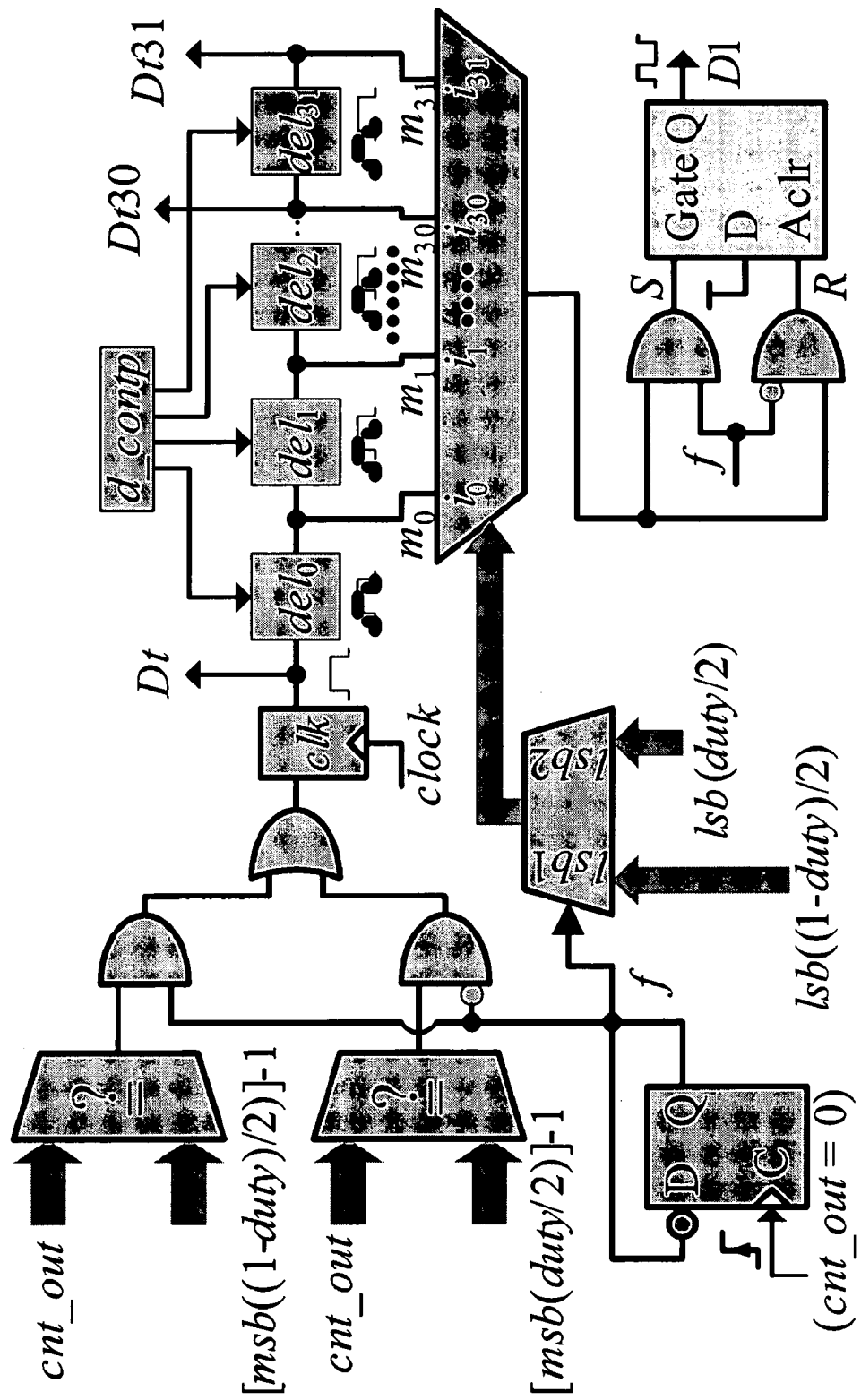
FIG. 12 shows another implementation for generating a pair of outputs in a triangular hybrid digital pulse-width-modulator implementation.

Input dead times are applied to the second output signal $D_2$, as shown in the timing diagram of FIG. 10. As a result, the set and reset events of the output $D_2$ may happen at any time inside of one clock period of the input clock signal clk. To generate both the set signal $S_2$ and the reset signal $R_2$, an approach with one or two delay lines may be used. FIG. 10, for example, shows a design with two delay lines. The second output signal $D_2$, however, may be generated using a single delay line in which more sophisticated combinatorial logic is used to generate the most-significant-bit portion dutyMSB of the duty cycle command and the least-significant-bit portion dutyLSB of the duty cycle command. In FIG. 12 discussed below, for example, a single delay line is shown for each output signal, $D_1$ and $D_2$, in a triangular DPWM implementation in which neither the set nor the reset points of the DPWM output are fixed.

In FIG. 9, however, the most-significant-bit portions dutyMSBs of the duty cycle command and the least-significant-bit portions dutyMSBs of the duty cycle command are given as follows.

$$dutyMSB_2 = msb(duty + t_{d2})$$

$$dutyLSB_2 = lsb(duty + t_{d2})$$

$$dutyMSB_3 = lsb(1 - t_{d1})$$

$$dutyMSB_2 = msb(1 - t_{d1})$$

The two delay lines for the output signal $D_2$ shown in FIG. 9 are identical and matched with the delay line shown in FIG. 5. Therefore, the same digital control signals d_contp, generated from the DLL shown in FIG. 6 can be used to control the delay of the discretely adjustable delay cells in the delay line shown in FIG. 9. It should also be noted that only one counter may be used to generate both output signals $D_1$ and $D_2$.

Leading Edge and Triangular DPWM

Although FIGS. 5 through 10 describe a trailing edge implementation in a hybrid DPWM, the design discussed above can also be extended to other modulation schemes, such as leading edge, triangular, and phase shift DPWM. In these modulation schemes, the structure of the hybrid DPWM, including the delay line, counter, and digital DLL is not changed. The combinatorial logics that provide the most-significant-bit portion dutyMSB or least-significant-bit portion dutyLSB of the duty cycle command can be modified for each scheme. In addition, the output latch of the hybrid DPWM can also be modified for each scheme.

Figure 11:
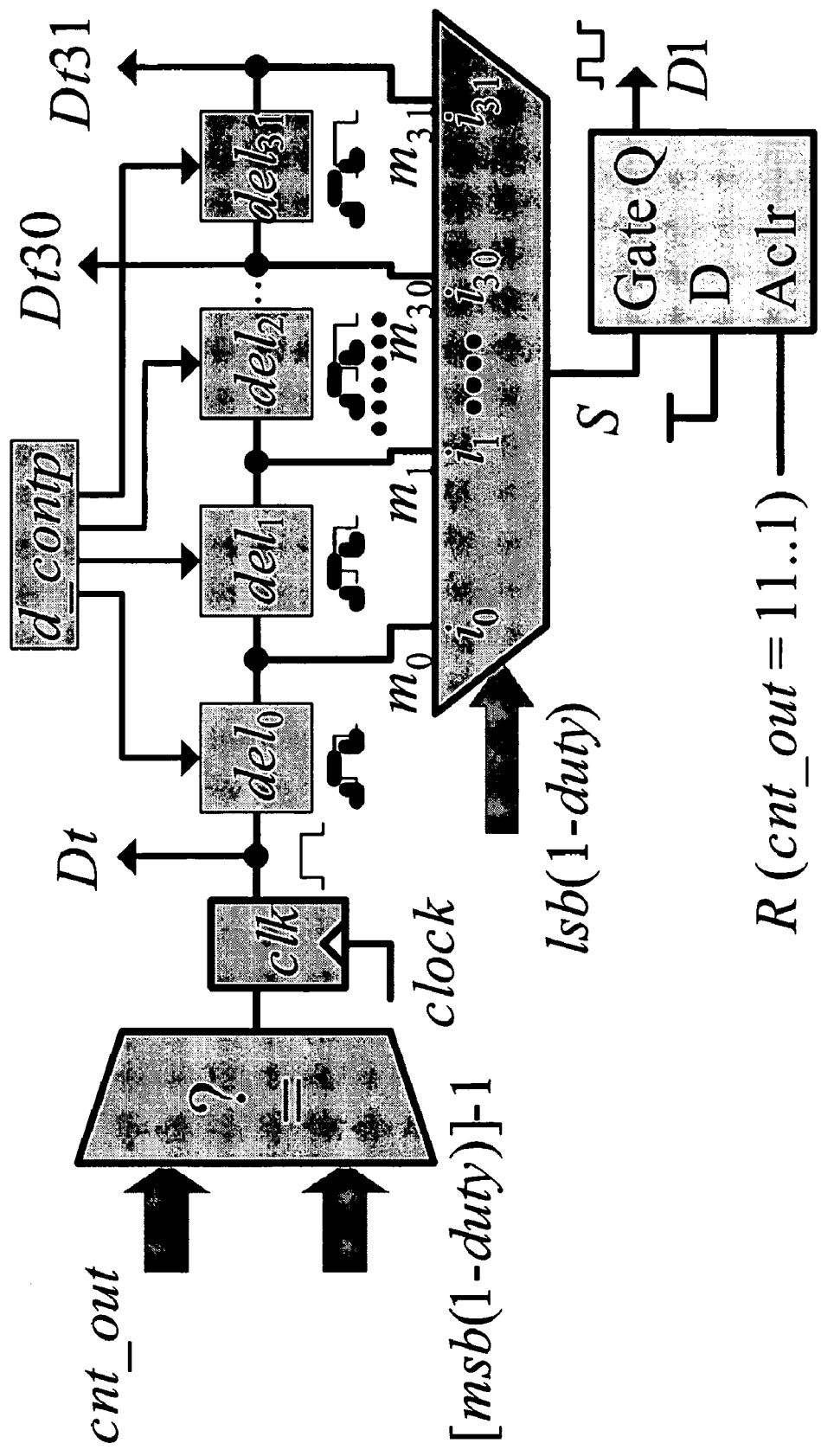
FIG. 11 shows an implementation of a leading edge hybrid digital pulse-width-modulator.

In a leading edge hybrid DPWM, the reset signal can be fixed to occur when the counter has reached its maximum count (at the end of the switching period Ts), while the set point of the DPWM occurs at the time when the output of the counter equals the value of (1−duty). FIG. 11, for example, shows an example implementation of a leading edge hybrid DPWM. The second output signal $D_2$ can also be implemented with the same technique or with the dual delay line technique shown in FIG. 9.

In a triangular modulation scheme, the modulation scheme can be divided into two trailing edge and leading edge modulation steps. During one switching period, a hybrid DPWM can be switched to a leading edge operation and the value of (1−duty)/2 is considered to determine the most-significant bit portion dutyMSB and least-significant-bit portion dutyLSB values for the DPWM. In the following switching cycle, however, the hybrid DPWM can be switched to a trailing edge modulation scheme and the value duty/2 is provided to determine the most-significant-bit portion dutyMSB and the least-significant-bit portion dutyLSB values. FIG. 12, for example, shows an example implementation of a triangular modulation scheme using a hybrid DPWM with a digital DLL. The second DPWM output D2, can be constructed using the same technique with one delay line or as in FIG. 9 with two delay lines.

EXAMPLE

A hybrid DPWM with a digital DLL was implemented on a field programmable gate array (FPGA) control board, which included a Xilinx Virtex II (XC2V100) chip. The hybrid DPWM had a ten-bit resolution, with a five-bit counter and a five-bit delay line (32 delay cells). An input clock frequency of $f_{clk}$=25 MHz was provided to the hybrid DPWM. The hybrid DPWM provided a switching frequency of $f_{sw}$=25

MHz/$2^5$=781 KHz. The delay through the delay line should be equal to one clock period, del$_{tot}$=1/25 MHz=40 ns. For the 32 delay cells, the average and nominal delay of one delay cell was Δt=40 ns/32=1.25 ns. A delay cell, as show in FIG. 4A, was chosen with an adjustment ratio of 1:2. Therefore, one set of a 32-bit shift register was used to provide 32 lines of delay control signals, d_contp.

Figure 13:
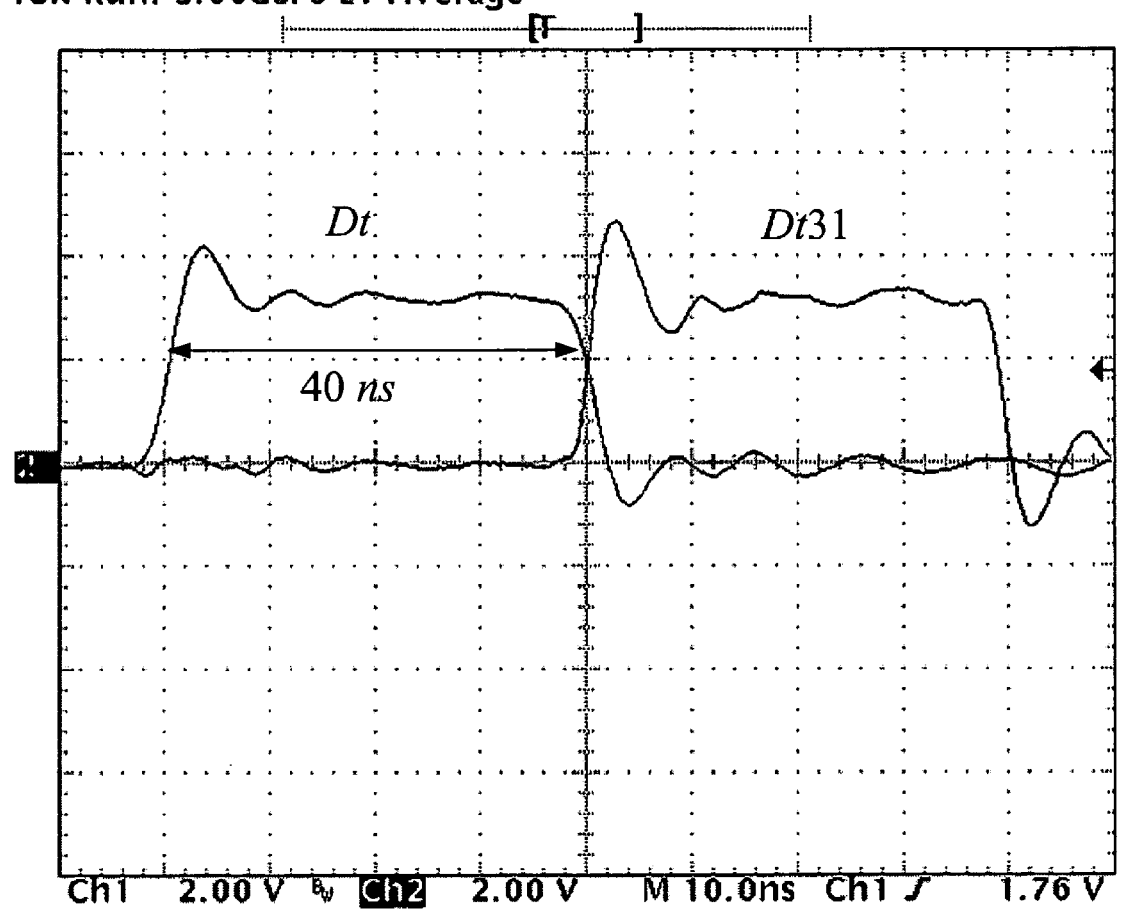
FIG. 13 shows an experimental waveform of a hybrid digital pulse-width-modulator implementation.

FIG. 13 shows an experimental waveform of Dt, the input clock of the delay line, and Dt$_{31}$, the propagated clock at the output of the delay line. FIG. 13 shows that the falling edge of the signal Dt is aligned with the rising edge of the propagated clock signal Dt$_{31}$. The delay control signals, d_contp, were monitored for this experimental setup and observed that 12 delay cells were adjusted to the low delay value and the remaining 20 delay cells were adjusted to the high delay value.

Figure 14:
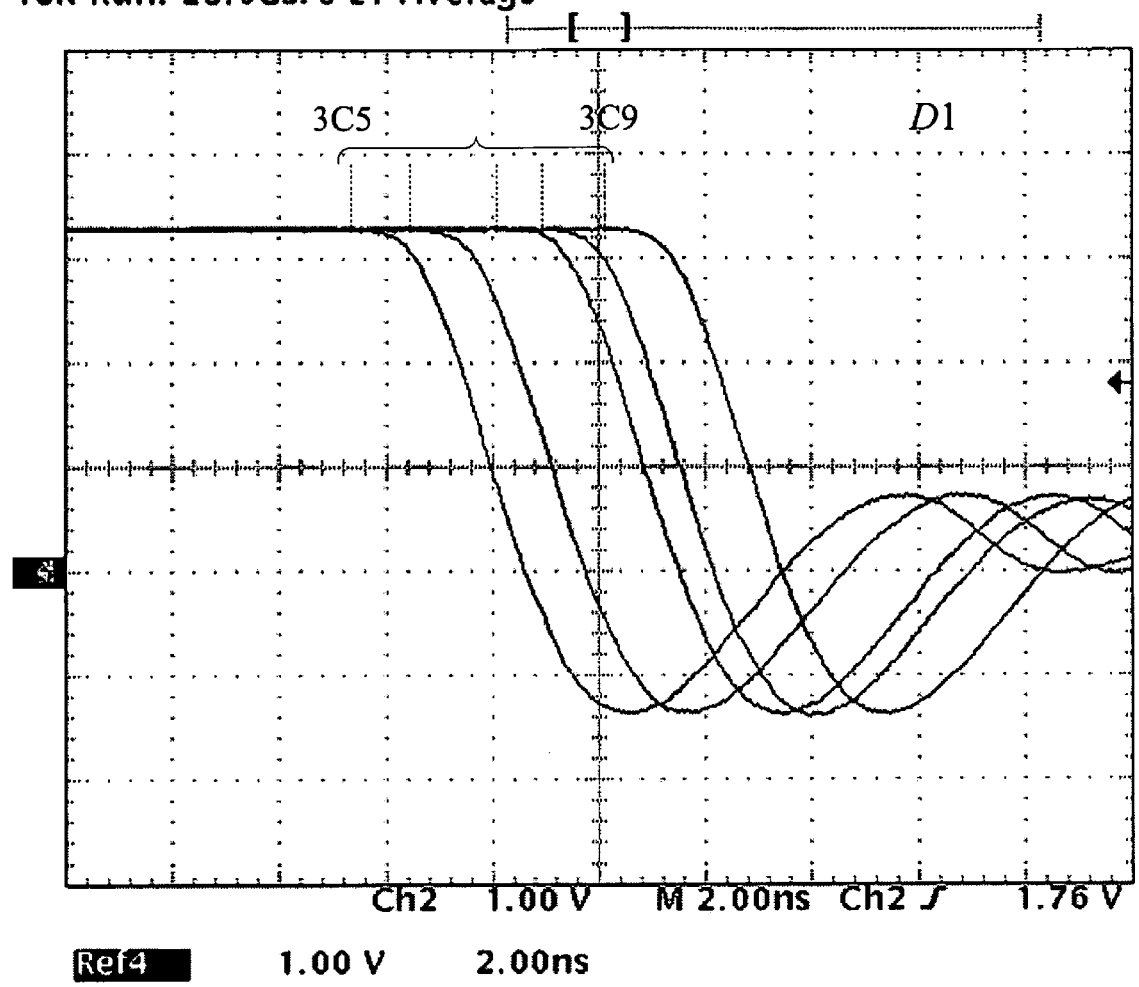
FIG. 14 shows the change in the output of the output signal of a hybrid digital pulse-width-modulator for different values of a duty cycle command.

FIG. 14 shows the change in the output of the output signal D$_1$ for different values of the duty cycle command. Specifically, in this example, a ten-bit duty cycle command was changed by one step from the value of 3C5 Hex to 3C9 Hex.

Figure 15:
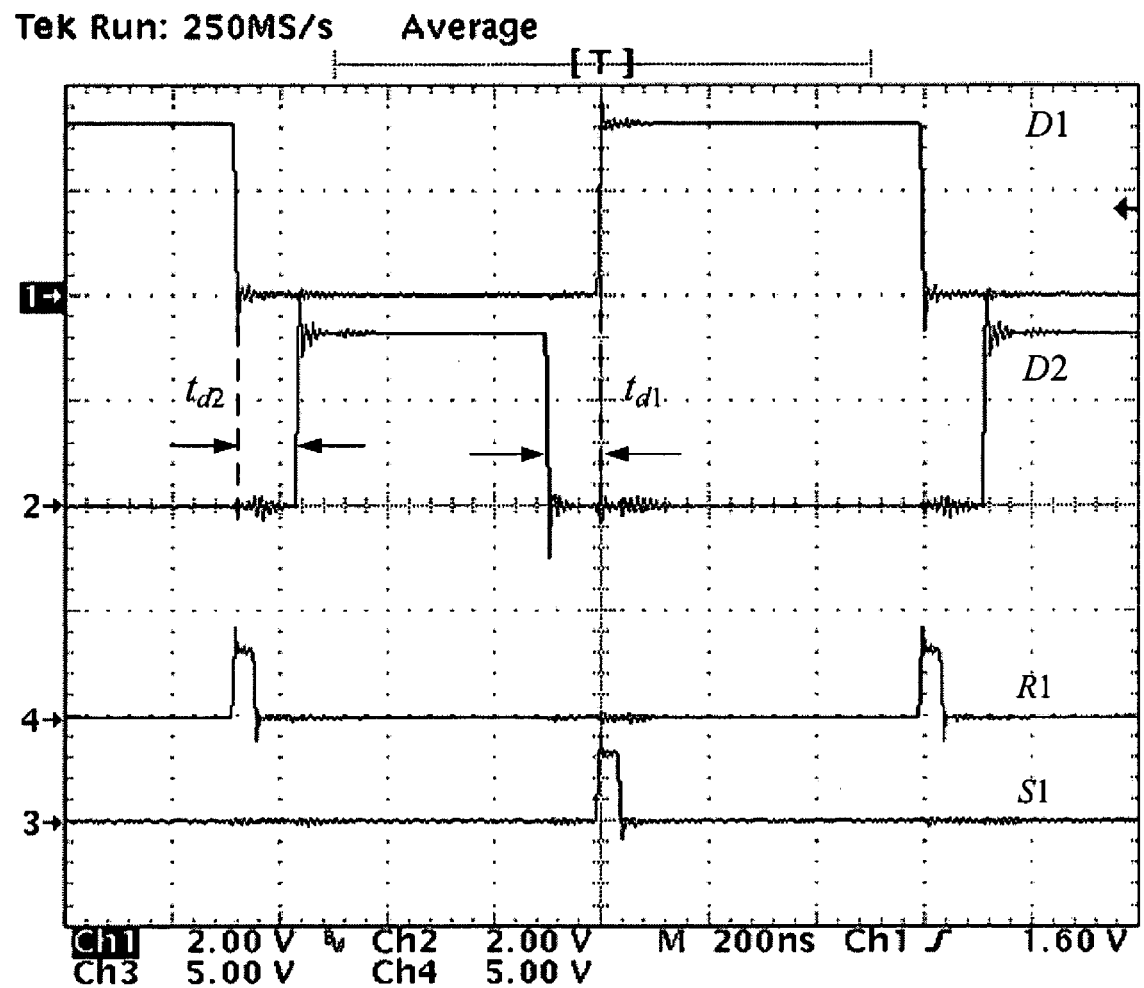
FIG. 15 shows two outputs of a hybrid digital pulse-width-modulator.

FIG. 15 shows two outputs of a hybrid DPWM, D$_1$ and D$_2$. Two dead-times t$_{d1}$ and t$_{d2}$ are applied to the output signal D$_2$. In the experimental setup, a ten-bit hybrid DPWM is provided with a switching frequency f$_{sw}$=781 KHz, while the input clock frequency is f$_{clk}$=25 MHz. This clock frequency would have produced only a five-bit resolution using a simple counter-based DPWM with the same switching frequency.

Figure 16:
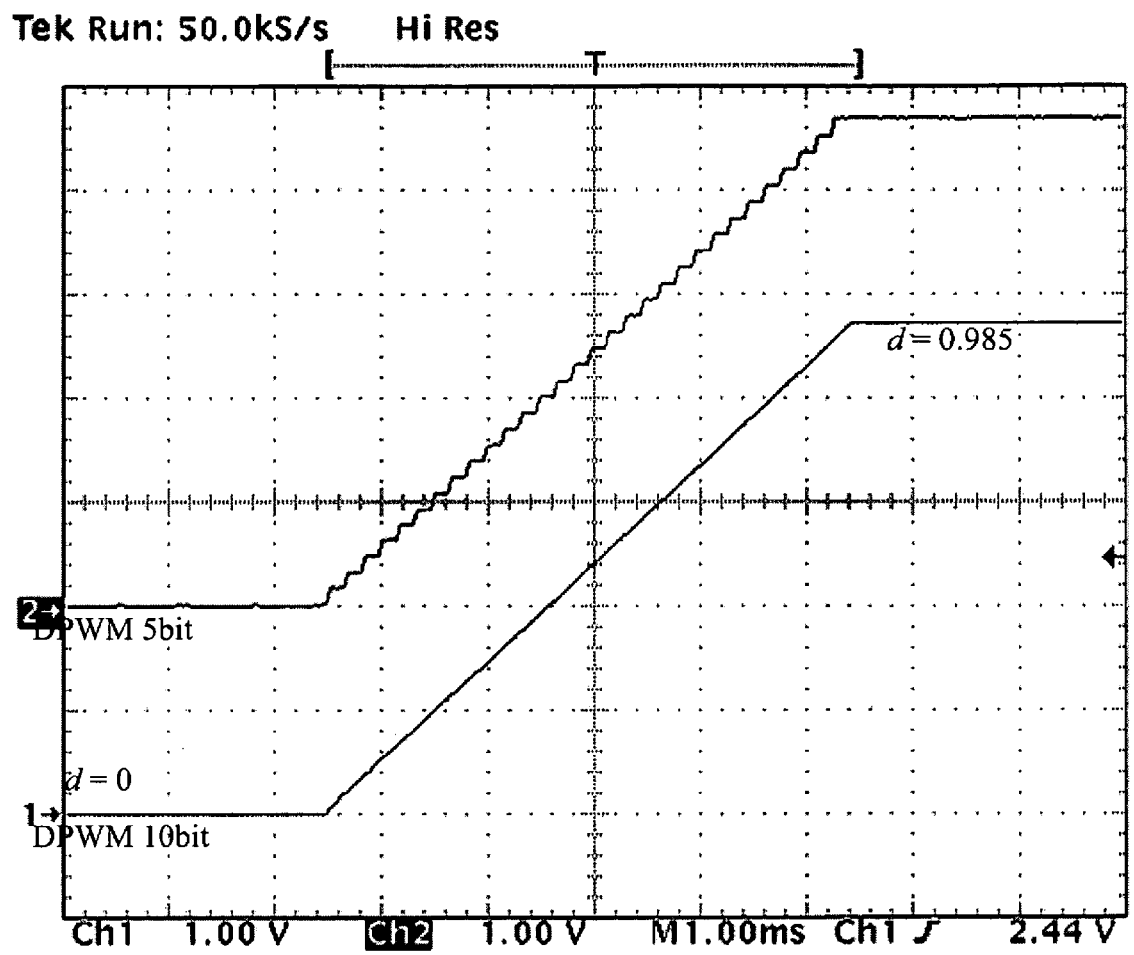
FIG. 16 shows a comparison of the output of a pair of digital pulse-width-modulators.

A low-pass filter using a resistor and a capacitor is constructed and placed on the hybrid DPWM output D$_1$. The duty cycle is then slowly increased from a zero value to a maximum value of d=0.985. FIG. 16 shows a comparison of the output of the low-pass filter for two cases of (1) a five-bit, counter-based DPWM and (2) a 10-bit hybrid DPWM, where the remaining five-bits is provided by a delay line. In both cases, the switching frequency f$_{sw}$=781 MHz and the clock frequency f$_{clk}$=25 MHz. It is observed that the hybrid DPWM significantly increases the resolution over the counter-based DPWM, while maintaining its linearity.

Hybrid PWM Design

A hybrid DPWM is particularly useful if the resolution of a counter-based DPWM is insufficient for a desired application. Because of its simplicity, linearity, and limited area required for hardware resources, the counter stage of the hybrid DPWM can be used for the majority of the resolution of the DPWM. The delay line stage can then be used to provide additional resolution to supplement the counter stage of the hybrid DPWM.

In designing a hybrid DPWM, the input clock frequency, f$_{clk}$, is typically considered first. The input clock frequency may be limited, for example, by hardware constraints, cost considerations, availability, or any other factor. The switching frequency, f$_{sw}$, and/or the desirable resolution of the hybrid DPWM can be considered along with the input clock frequency. Having either of a desirable switching frequency f$_{sw}$ or a maximum DPWM resolution can be used to determine the other value. In this example, it is assumed that the desired switching frequency, f$_{sw}$, is known and the maximum achievable resolution of the DPWM is the result of the design. A designer could just as easily start with a desired resolution, however, instead of a switching frequency.

In this example, the maximum number of bits, n, of the counter can be determined from the following formula.

$$n = \text{Log}_2(f_{clk}/f_{sw}) \quad (7)$$

To obtain an integer value for n, it is desirable that the clock frequency fclk and the switching frequency fsw have the following relationship described above.

$$f_{clk} = 2^n f_{sw}$$

If the value of n is not an integer value, however, the value of n may be rounded to the next integer value.

The maximum length and achievable resolution of the delay line can be found from the process characteristics in which the DPWM is implemented. First, the delay element for the delay cells in the delay line may be selected. Typical examples include nor gates, inverters, or tri-state buffers. The delay cell may be constructed using the selected delay elements (e.g., two nor gates, two inverters, or one tri-state buffer). The maximum delay, Δt$_{max}$, through the delay cell can be determined for the worst anticipated case of temperature, process, and voltage variations. As described above, the delay through the delay line is preferably equal to one clock period of T$_{clk}$=1/f$_{clk}$. The maximum number of bits, l, of the delay line can then be found by the following formula.

$$l = \text{Int}[\text{Log}_2(T_{clk}/\Delta t_{max})]$$

The delay adjustment ratio, m, discussed above with respect to FIG. 6, can be found from the ratio of Δt$_{max}$/Δt$_{min}$. The value of Δt$_{min}$ is the minimum delay of the simplest delay cell that is found for variations in temperature, process, or supply voltage. The delay adjustment ratio can thus be determined by the following formula.

$$m = \Delta t_{max}/\Delta t_{min}$$

The value of m is rounded to the next integer value. As shown in FIG. 4B, each individual delay cell has m delay branches. It can be assumed that the delay branches are designed such that the ith branch has an equivalent delay of i·Δt, where Δt comprises the delay of the first branch (the delay branch with the shortest possible delay). Each delay cell has m−1 input control signals.

The delay locked loop has m−1 sets of $2^l$-bit shift registers, which corresponds to $2^l$·(m−1) bits. As discussed above with respect to FIG. 6, two more bits (e.g., UP$_{lim}$ and LOW$_{lim}$) can be added to the shift register.

The total number of bits of the hybrid DPWM is N=n+l. Without changing the design of the delay line, the number of bits of the counter, n, can be increased or decreased to provide different values of the switching frequency, f$_{sw}$. For example, by having n=0 (no counter in the circuit), the switching frequency is increased to f$_{sw}$=f$_{clk}$. On the other hand, the switching frequency, f$_{sw}$, can be decreased and the DPWM can obtain a higher resolution by increasing the number of bits, n, of the counter stage.

Phase-Locked-Loop

Figure 17:
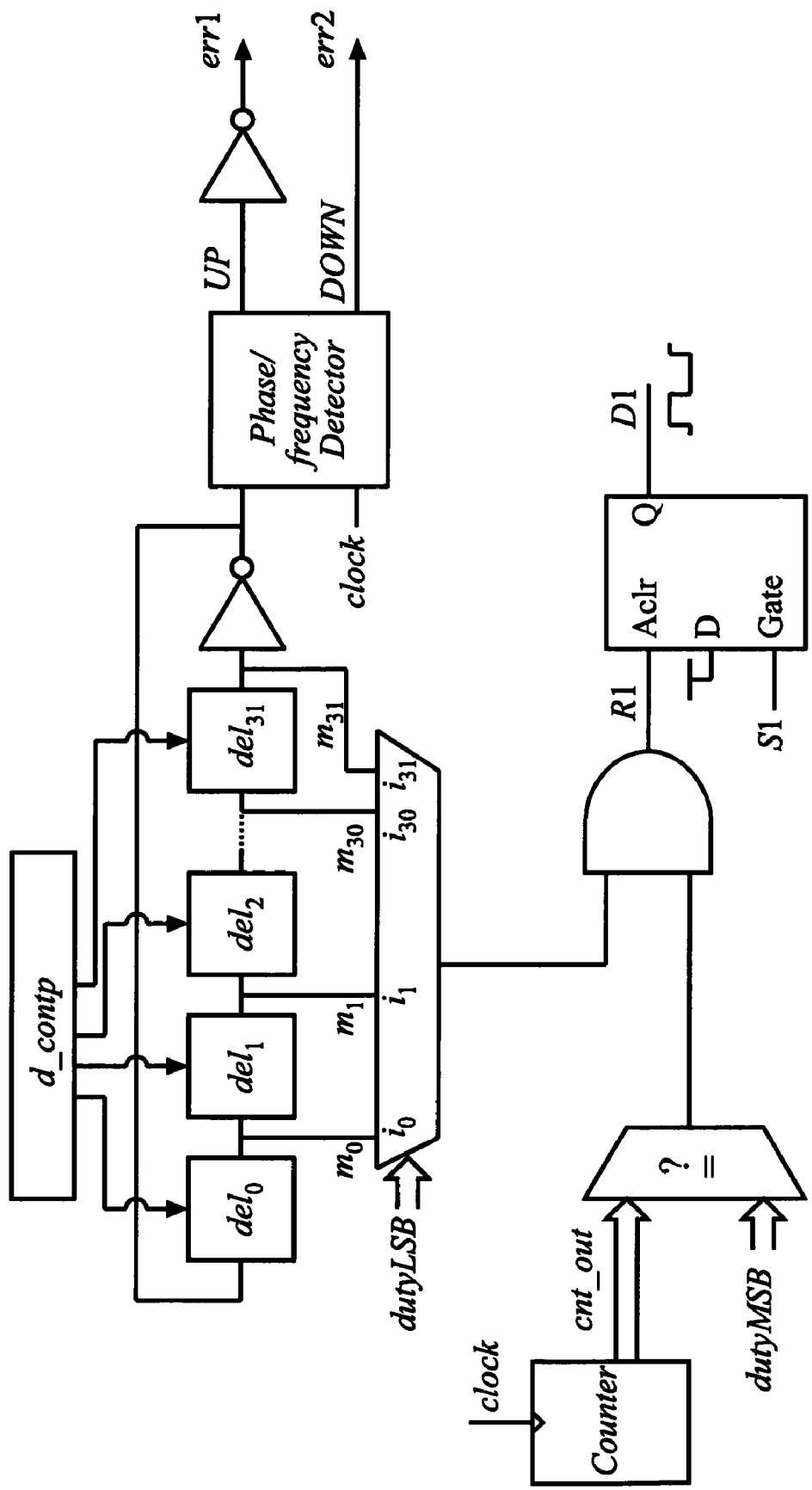
FIG. 17 shows a hybrid digital pulse-width-modulator with a digital phase-locked loop generating a pulse-width-modulated output based on trailing-edge modulation.

FIG. 17 shows a hybrid DPWM with a digital phase-locked loop (DPLL) generating a pulse-width-modulated output D1 based on trailing-edge modulation. Other DPWM types can be easily constructed following the same principles.

In the hybrid DPWM shown in FIG. 17, delay cells with discretely adjustable delays form a ring oscillator. Although the embodiment shown in FIG. 17 shows that each delay cell of the ring oscillator are discretely adjustable, only a subset of one or more delay cells of the ring oscillator may be discretely adjustable.

A phase/frequency detector compares the phase and frequency of the ring oscillator output to a reference clock clock and generates the digital error signals err1 and err2. Digital control of the cell delays is accomplished based on the error signals err1 and err2 as shown in FIG. 6. In steady-state, the ring oscillator frequency and phase approximately match the reference clock frequency and phase.

Course adjustment of the output pulse width is based on a comparison of the MSB portion dutyMSB of the duty-cycle command with the counter output cnt_out. The LSB portion dutyLSB of the duty-cycle command selects a tap from the ring oscillator to finely adjust the output pulse width.

Although several embodiments of this invention have been described above with a certain degree of particularity, those skilled in the art could make numerous alterations to the disclosed embodiments without departing from the spirit or scope of this invention. For example, although a hybrid DPWM is primarily discussed, the concepts disclosed herein can also be simply extended to other topologies, such as a pure delay line or a ring oscillator type DPWM. In addition, various types of pulse-width-modulation can be performed, such as trailing edge, leading edge, triangular, or phase shift modulation.

All directional references (e.g., upper, lower, upward, downward, left, right, leftward, rightward, top, bottom, above, below, vertical, horizontal, clockwise, and counter-clockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A digital pulse-width modulator comprising:
   a delay line comprising an input for receiving an input signal and a plurality of delay cells connected in series, the plurality of delay cells comprising at least two discretely adjustable delay cells, wherein the delay line is configured to propagate the input signal through the plurality of delay cells;
   a multiplexer comprising a plurality of inputs and an output, each of the plurality of inputs of the multiplexer coupled to an output of one of the plurality of delay cells of the delay line, wherein the output of the multiplexer is selected from the plurality of inputs of the multiplexer based upon at least a portion of a duty cycle command; and
   a controller coupled to outputs of at least two delay cells in the delay line, the controller sampling the outputs at the end of a reference period to obtain a first sampled discrete value and a second sampled discrete value, comparing the first discrete value to the second discrete value, and determining a digital control code for discretely and independently adjusting a delay of the discretely adjustable delay cells based upon the comparison of the first discrete value to the second discrete value.

2. The digital pulse-width modulator of claim 1 wherein each of the plurality of delay cells of the delay line comprises a discretely adjustable delay cell.

3. The digital pulse-width modulator of claim 2 wherein the controller is configured to discretely and independently control a delay of each of the discretely adjustable delay cells in the delay line.

4. The digital pulse-width modulator of claim 1 wherein a first tap of the delay line is located at a beginning of the delay line.

5. The digital pulse-width modulator of claim 4 wherein a second tap of the delay line is located at an output of the delay line.

6. The digital pulse-width-modulator of claim 5 wherein a third tap of the delay line is located between the first tap and the second tap along the delay line.

7. The digital pulse-width-modulator of claim 6 wherein the controller samples a third discrete value at the third tap of the delay line and determines the digital control code for discretely and independently adjusting the delay of the discretely adjustable delay cells based upon the comparison of the first discrete value, the second discrete value, and the third discrete value.

8. The digital pulse-width modulator of claim 1 wherein the digital pulse-width-modulator comprises one of the group consisting of: a delay line digital pulse-width-modulator, a hybrid digital pulse-width-modulator, and a ring oscillator type digital pulse-width-modulator.

9. The digital pulse-width modulator of claim 1 wherein the discretely adjustable delay cells comprise a plurality of parallel branches.

10. The digital pulse-width modulator of claim 9 wherein at least a portion of the digital control code is used to select one of the plurality of parallel branches of the discretely adjustable delay cells.

11. The digital pulse-width modulator of claim 1 wherein the controller comprises at least one flip-flop and a shift register.

12. The digital pulse-width modulator of claim 11 wherein the shift register comprises at least $2^l$ bits, wherein l comprises the number of bits in the portion of the duty cycle command resolved by the adjustable delay line.

13. The digital pulse-width modulator of claim 12 wherein the shift register comprises bins for an upper limit bit and a lower limit bit.

14. The digital pulse-width modulator of claim 1 wherein the delay line is implemented on a field programmable gate array.

15. The digital pulse-width modulator of claim 1 wherein the digital control code comprises a thermometer code.

16. The digital pulse-width-modulator of claim 1 wherein the reference period is generated based upon the input signal to the delay line.

17. A hybrid digital pulse-width-modulator (DPWM) comprising:
   a counter stage comprising:
   a counter for providing a count signal, and
   a comparator coupled to the counter to receive the count signal, the comparator further configured to receive a first portion of a duty cycle command and to provide a counter stage output signal based on the count signal and the first portion of the duty cycle command;
   an adjustable delay line stage comprising:
   a plurality of delay cells configured in series, at least two of the plurality of delay cells comprising a discretely adjustable delay cell with a digital adjustment input, a first delay cell of the plurality of delay cells coupled to the counter stage to receive the counter output signal,
   a multiplexer comprising at least two data inputs coupled to the outputs of at least two of the plurality of delay cells and a selector input for receiving a second portion of the duty cycle command, the multiplexer outputting an input signal received at one of the data inputs based upon the second portion of the duty cycle command, and
   a controller coupled to an input of the plurality of delay cells to receive the counter stage output signal and to an output of at least one of the plurality of delay cells to receive a delayed signal, the controller configured to generate a digital adjustment signal to discretely and independently control a delay of the discretely adjustable delay cells via the digital adjustment input of the discretely adjustable delay cells based upon a comparison of the counter stage output signal and the delayed signal.

18. The hybrid DPWM of claim 17 wherein the controller is configured to compare a trailing edge of the counter stage output signal to a leading edge of the delayed signal.

19. The hybrid DPWM of claim 17 wherein the controller is configured to compare a leading edge of the counter stage output signal to a trailing edge of the delayed signal.

20. The hybrid DPWM of claim 17 wherein the controller is configured to independently control a delay of each of the plurality of delay cells in the adjustable delay line stage.

21. The hybrid DPWM of claim 17 wherein the controller comprises at least one flip-flop and a shift register.

22. The hybrid DPWM of claim 21 wherein the shift register comprises at least $2^l$ bits, wherein l comprises the number of bits in the second portion of the duty cycle command.

23. The hybrid DPWM of claim 22 wherein the shift register comprises bins for an upper limit bit and a lower limit bit.

24. The hybrid DPWM of claim 17 wherein the adjustable delay cells comprise a plurality of parallel branches.

25. The hybrid DPWM of claim 17 wherein the counter stage further comprises a flip-flop coupled to the comparator.

26. The hybrid DPWM of claim 17 wherein the DPWM is implemented on a field programmable gate array.

27. A method for controlling a delay of a delay line of a digital pulse-width-modulator, the method comprising:
  receiving a signal at a delay line of the digital pulse-width-modulator;
  propagating the signal through a plurality of delay cells of a delay line, at least two of the plurality of delay cells comprising a discretely adjustable delay cell;
  providing an output of at least two of the plurality of delay cells of the delay line to a multiplexer;
  selecting one of the outputs of the delay cells at the multiplexer based on at least a portion of a duty cycle command;
  sampling the signal at the end of a reference period at an output of a first delay cell in the delay line and an output of a second delay cell in the delay line to obtain a first sampled discrete value and a second sampled discrete value;
  comparing the first discrete value to the second discrete value;
  determining a digital control code for discretely and independently adjusting a delay of the discretely adjustable delay cells based upon the comparison of the first discrete value to the second discrete value; and
  applying the digital control code to the discretely adjustable delay cells to adjust a delay of the discretely adjustable delay cells.

28. The method of claim 27 wherein the end of the reference period corresponds to a falling edge of signal.

29. The method of claim 27 wherein the sampling operation comprises sampling an output of a third delay cell in the delay line located between the first delay cell and the second delay cell to obtain a third sampled discrete value.

30. The method of claim 29 wherein the determining operation comprises determining the digital control code for discretely and independently adjusting the delay of the discretely adjustable delay cells based upon the comparison of the first discrete value, the second discrete value, and the third discrete value.

31. The method of claim 27 wherein the delay line comprises a plurality of discretely adjustable delay cells.

32. The method of claim 31 wherein the digital control code comprises a thermometer code.

33. The method of claim 32 wherein ones of the thermometer code are distributed among zeros of the thermometer code to improve linearity of the digital pulse-width-modulator.

34. The method of claim 27 wherein the delay cell comprises a plurality of parallel branches.

35. The method of claim 27 wherein the digital pulse-width-modulator comprises a hybrid digital pulse-width-modulator.

36. The method of claim 35 further comprising comparing a count signal to a first signal derived from a first portion of the duty cycle command in a counter stage of the hybrid DPWM to provide the signal to the delay line.

37. A digital pulse-width-modulator with a digital phase-locked loop comprising:
  a ring oscillator comprising a plurality of delay cells, at least two of the delay cells comprising a discretely adjustable delay cell;
  a phase/frequency detector coupled to an output of the ring oscillator, the phase/frequency detector compares a phase and a frequency of the ring oscillator output to a phase and a frequency of a reference clock and generates a pair of digital error signals;
  a controller coupled to the discretely adjustable delay cells of the ring oscillator to discretely and independently control a delay of the discretely adjustable delay cells via a digital control command, the digital controller generating the digital control command based on the pair of digital error signals;
  a multiplexer comprising a plurality of inputs coupled to the plurality of delay cells of the ring oscillator and an output for providing a multiplexer output signal corresponding to one of the plurality of inputs, wherein the multiplexer output signal is selected from the plurality of inputs based upon a first portion of a duty cycle command; and
  a comparator comprising a pair of inputs for receiving a counter signal and a second portion of the duty cycle command and an output,
  wherein course adjustment of an output pulse width of the digital pulse-width modulator is based on the output of the comparator and fine adjustment of the output pulse width of the digital pulse-width modulator is based on the multiplexer output signal.

38. The digital pulse-width-modulator of claim 37 wherein the frequency of the ring oscillator output approximately matches frequency of the reference clock in steady state operation.

* * * * *